US012641965B2

(12) United States Patent
Yang et al.

(10) Patent No.: US 12,641,965 B2
(45) Date of Patent: May 26, 2026

(54) DISPLAY PANEL, METHOD FOR MANUFACTURING THE SAME, AND DISPLAY APPARATUS

(71) Applicant: Shanghai Tianma Micro-Electronics Co., Ltd., Shanghai (CN)

(72) Inventors: Xiaodong Yang, Shanghai (CN); Meng Qu, Shanghai (CN); Ye Yan, Shanghai (CN); Lu Xie, Shanghai (CN); Jiandong Wang, Shanghai (CN); Xiongping Li, Shanghai (CN); Shengchao Ji, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 620 days.

(21) Appl. No.: 18/146,517

(22) Filed: Dec. 27, 2022

(65) Prior Publication Data

US 2023/0133786 A1 May 4, 2023

(30) Foreign Application Priority Data

Jul. 1, 2022 (CN) .......................... 202210774115.0

(51) Int. Cl.
*H10K 59/124* (2023.01)
*G02F 1/1343* (2006.01)
(Continued)

(52) U.S. Cl.
CPC ..... *H10K 59/124* (2023.02); *G02F 1/134345* (2021.01); *G02F 1/136227* (2013.01);
(Continued)

(58) Field of Classification Search
CPC .................. H10K 59/124; H10K 59/40; G02F 1/134345; G02F 1/136227; G02F 1/1368; G06F 3/0412
See application file for complete search history.

(56) References Cited

U.S. PATENT DOCUMENTS 11,737,340 B2 * 8/2023 Li ...................... G06F 3/04164
345/156
11,813,123 B2 * 11/2023 Yang ..................... A61B 8/481
(Continued)

FOREIGN PATENT DOCUMENTS

CN     102096230 B     7/2014
CN     110634403 B     3/2022

*Primary Examiner* — Marlon T Fletcher
*Assistant Examiner* — Kimberly Newman Frey
(74) *Attorney, Agent, or Firm* — CHRISTENSEN O'CONNOR JOHNSON KINDNESS PLLC

(57) ABSTRACT

A display panel, a method for manufacturing the display panel, and a display apparatus are described. In an embodiment, the display panel includes a display area and a non-display area; a substrate; an organic layer located at a side of the substrate and located in the display area and the non-display area, in which the organic layer includes a first portion located in the non-display area; and an organic layer protection structure located on a surface of the organic layer facing away from the substrate. In an embodiment, the organic layer protection structure includes a first structure in the display area and a second structure in the non-display area. In an embodiment, the second structure overlaps the first portion in a direction perpendicular to a plane of the substrate. In an embodiment, the first structure and the second structure are in direct contact with the organic layer.

16 Claims, 18 Drawing Sheets

(51) Int. Cl.
    G02F 1/1362 (2006.01)
    G02F 1/1368 (2006.01)
    G06F 3/041 (2006.01)
    H10K 59/40 (2023.01)

(52) U.S. Cl.
    CPC .......... G06F 3/0412 (2013.01); *G02F 1/1368*
                  (2013.01); *H10K 59/40* (2023.02)

(56)                 References Cited

U.S. PATENT DOCUMENTS

2021/0408511 A1\* 12/2021 Qin ...................... H10K 50/844
2024/0049552 A1\*  2/2024 Kim ..................... H10K 59/122

\* cited by examiner

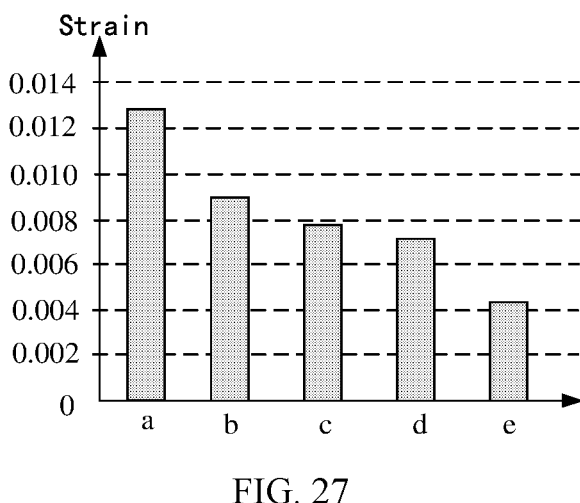

FIG. 27

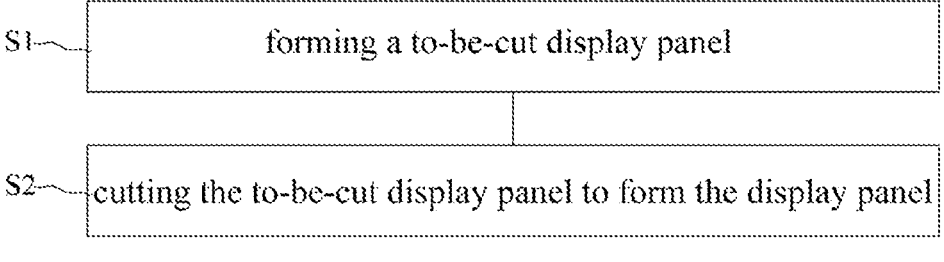

S1 — forming a to-be-cut display panel

S2 — cutting the to-be-cut display panel to form the display panel

FIG. 28

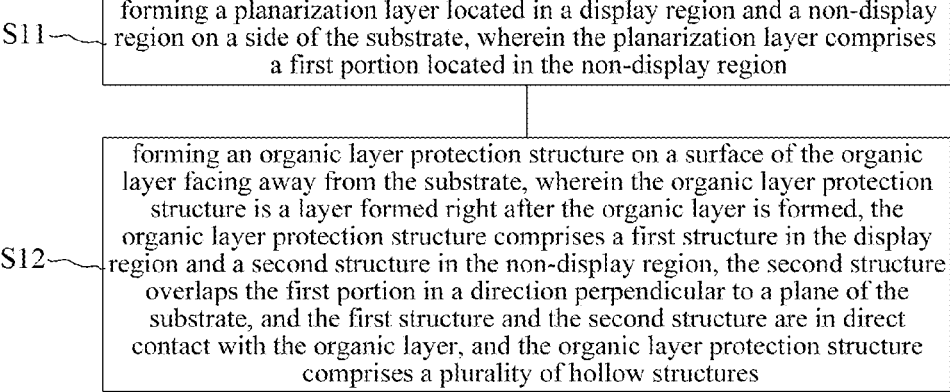

S11 — forming a planarization layer located in a display region and a non-display region on a side of the substrate, wherein the planarization layer comprises a first portion located in the non-display region S12 — forming an organic layer protection structure on a surface of the organic layer facing away from the substrate, wherein the organic layer protection structure is a layer formed right after the organic layer is formed, the organic layer protection structure comprises a first structure in the display region and a second structure in the non-display region, the second structure overlaps the first portion in a direction perpendicular to a plane of the substrate, and the first structure and the second structure are in direct contact with the organic layer, and the organic layer protection structure comprises a plurality of hollow structures

FIG. 29

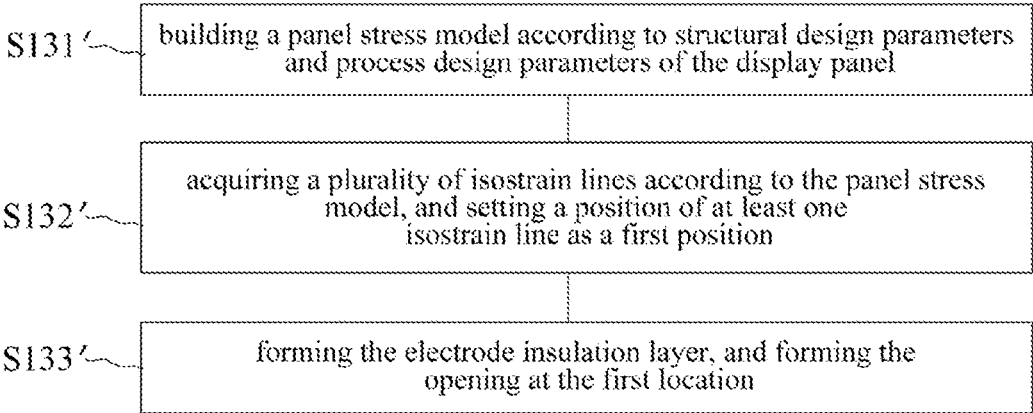

S131'  building a panel stress model according to structural design parameters and process design parameters of the display panel S132'  acquiring a plurality of isostrain lines according to the panel stress model, and setting a position of at least one isostrain line as a first position S133'  forming the electrode insulation layer, and forming the opening at the first location

FIG. 32

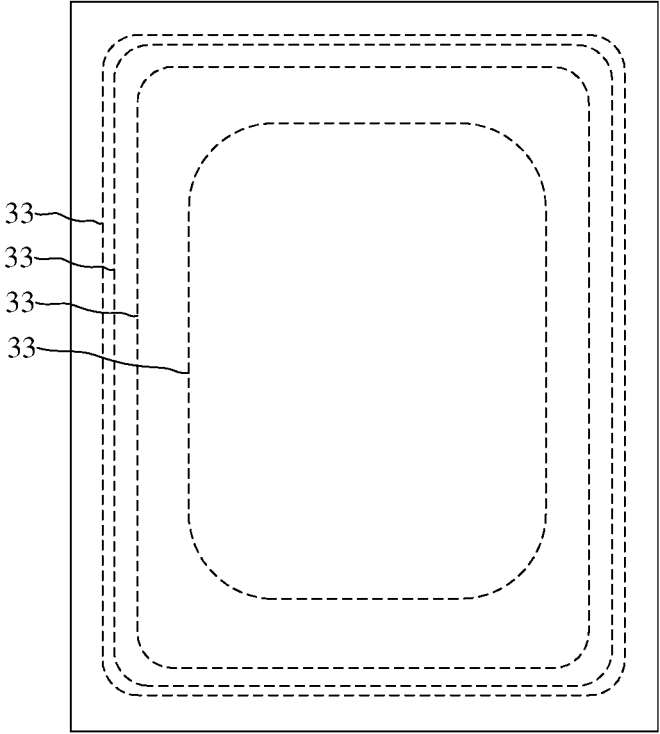

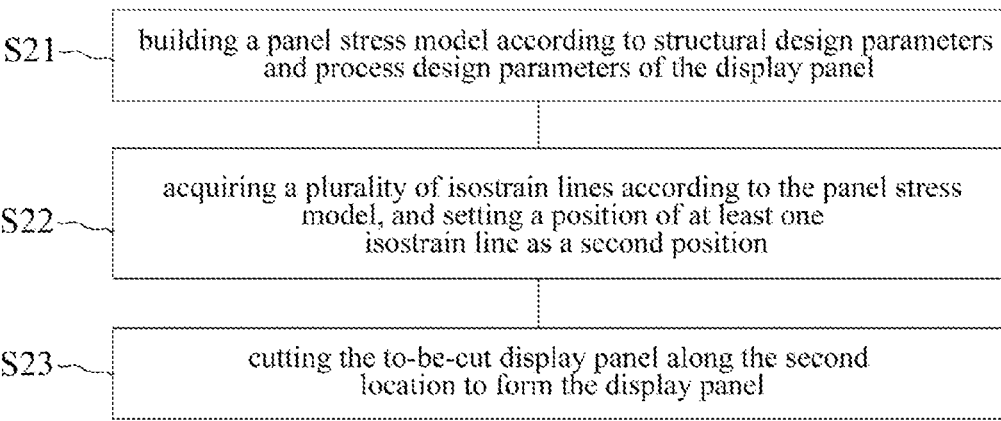

S21 — building a panel stress model according to structural design parameters and process design parameters of the display panel S22 — acquiring a plurality of isostrain lines according to the panel stress model, and setting a position of at least one isostrain line as a second position S23 — cutting the to-be-cut display panel along the second location to form the display panel

FIG. 34

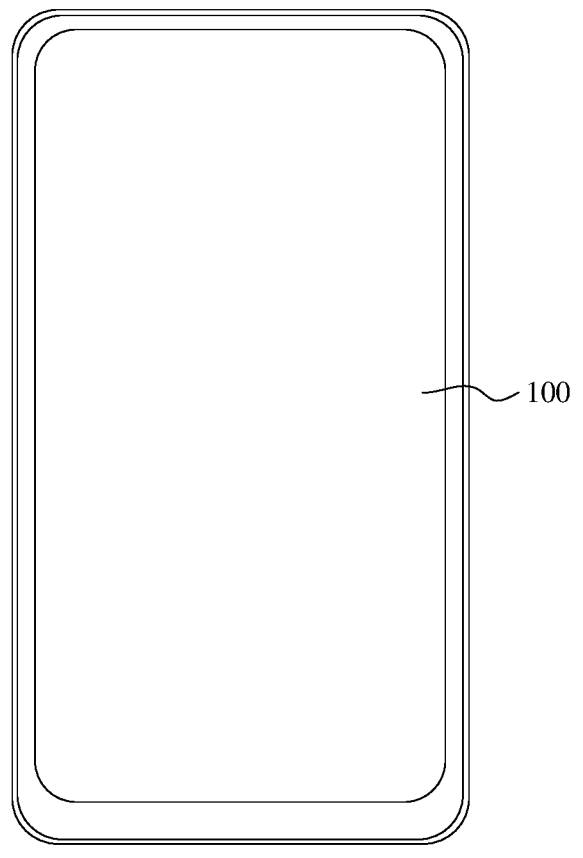

DISPLAY PANEL, METHOD FOR MANUFACTURING THE SAME, AND DISPLAY APPARATUS

CROSS-REFERENCE TO RELATED APPLICATION

The present disclosure claims to the benefit of Chinese Patent Application No. 202210774115.0, filed on Jul. 1, 2022, the content of which is incorporated herein by reference in its entirety.

TECHNICAL FIELD

The present disclosure relates to the field of display technologies, and in particular, to a display panel, a method for manufacturing the display panel, and a display apparatus.

BACKGROUND

Certain conventional display panels are prone to film detachment, resulting in poor structural stability of the display panel. In particular, for display panels used in the in-vehicle area, this type of display panel requires more reliability. If the structural stability of this type of display panel is problematic, the driver's driving safety is negatively affected.

SUMMARY

In a first aspect, the present disclosure provides a display panel. In an embodiment, the display panel includes a display area and a non-display area; a substrate; an organic layer located at a side of the substrate and located in the display area and the non-display area, in which the organic layer includes a first portion located in the non-display area; and an organic layer protection structure located on a surface of the organic layer facing away from the substrate. In an embodiment, the organic layer protection structure includes a first structure in the display area and a second structure in the non-display area. In an embodiment, the second structure overlaps the first portion in a direction perpendicular to a plane of the substrate. In an embodiment, the first structure and the second structure are in direct contact with the organic layer. In an embodiment, the organic layer protection structure includes a hollow structure.

In a second aspect, the present disclosure provides a method for manufacturing the display panel described in the first aspect. In an embodiment, the method includes: forming a to-be-cut display panel; cutting the to-be-cut display panel to form the display panel. In an embodiment, forming the to-be-cut display panel includes: forming an organic layer located in a display area and a non-display area on a side of the substrate, the organic layer includes a first portion located in the non-display area; and forming an organic layer protection structure on a surface of the organic layer facing away from the substrate. In an embodiment, the organic layer protection structure is a layer formed right after the organic layer is formed, the organic layer protection structure includes a first structure in the display area and a second structure in the non-display area, the second structure overlaps the first portion in a direction perpendicular to a plane of the substrate, and the first structure and the second structure are in direct contact with the organic layer, and the organic layer protection structure includes a plurality of hollow structures.

2

In a third aspect, the present disclosure provides a display apparatus. In an embodiment, the display apparatus includes the display panel described in the first aspect.

BRIEF DESCRIPTION OF DRAWINGS

In order to more clearly illustrate technical solutions of embodiments of the present disclosure, the accompanying drawings used in the embodiments are briefly described below. The drawings described below are merely a part of the embodiments of the present disclosure. Based on these drawings, those skilled in the art can obtain other drawings.

FIG. 27 is a histogram of strain of a first electrode according to an embodiment of the present disclosure;

FIG. 28 is a flowchart of a method for manufacturing a display panel according to an embodiment of the present disclosure;

FIG. 29 is a flowchart of a method for manufacturing a display panel according to another embodiment of the present disclosure;

FIG. 32 is a flowchart of a method for manufacturing a display panel according to another embodiment of the present disclosure;

FIG. 33 is a schematic diagram of a panel stress model according to an embodiment of the present disclosure;

FIG. 34 is a flowchart of a method for manufacturing a display panel according to another embodiment of the present disclosure; and FIG. 35 is a structural schematic diagram of a display apparatus according to an embodiment of the present disclosure.

DESCRIPTION OF EMBODIMENTS

In order to better understand technical solutions of the present disclosure, the embodiments of the present disclosure are described in details with reference to the drawings.

It should be clear that the described embodiments are merely part of the embodiments of the present disclosure rather than all of the embodiments. All other embodiments obtained by those skilled in the art without paying creative labor shall fall into the protection scope of the present disclosure.

The terms used in the embodiments of the present disclosure are merely for the purpose of describing embodiments, rather than limiting the present disclosure. The terms "a", "an", "the" and "said" in a singular form in the embodiments of the present disclosure and the attached claims are also intended to include plural forms thereof, unless noted otherwise.

It should be understood that the term "and/or" used in the context of the present disclosure is to describe a correlation relation of related objects, indicating that there may be three relations, e.g., A and/or B may indicate only A, both A and B, and only B. In addition, the symbol "/" in the context generally indicates that the relation between the objects in front and at the back of "/" is an "or" relationship.

Display panels in the related art are typically provided with an organic layer to achieve planarization of layers. The inventors have found during the study process that such an organic layer may release a large amount of water vapor during the manufacturing process, thereby causing the other layers on top of the organic layer to bulge, resulting in a layer detachment problem.

The water vapor released from the organic layer may be generated during its manufacturing process. The organic layer is usually formed by a coating process. Since the temperature of the coating process is low and air bubbles are easily generated, when the electrode and/or layer structures such as silicon nitride layer are formed after the organic layer is formed, a high-temperature environment is required, the organic layer is subjected to a high temperature, and the air bubbles generated in the organic layer are further released to bulge the upper layer.

Figure 1:
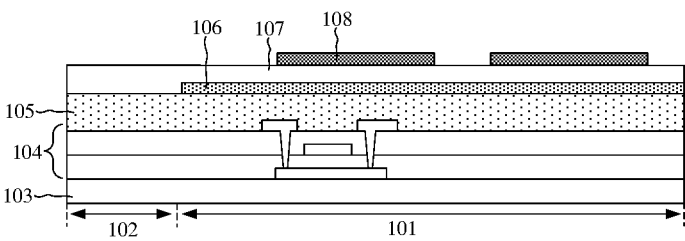
FIG. 1 is a structural schematic diagram of layers of a display panel of the prior art.

Alternatively, the water vapor released from the organic layer may be absorbed from the outside. Taking the panel structure shown in FIG. 1 as an example, as shown in FIG. 1, which is a structural schematic diagram of layers of a display panel in a related art, the display panel includes a display area 101 and a non-display area 102. The display panel further includes a substrate 103, and a transistor layer 104, an organic layer 105, a first electrode 106, an electrode insulation layer 107, and a second electrode 108 that are sequentially provided on the substrate 103. The first electrode 106 and the second electrode 108 are located in the display area 101. When the display panel displays images, liquid crystal molecules rotate under the electric field formed by the first electrode 106 and the second electrode 108.

Figure 2:
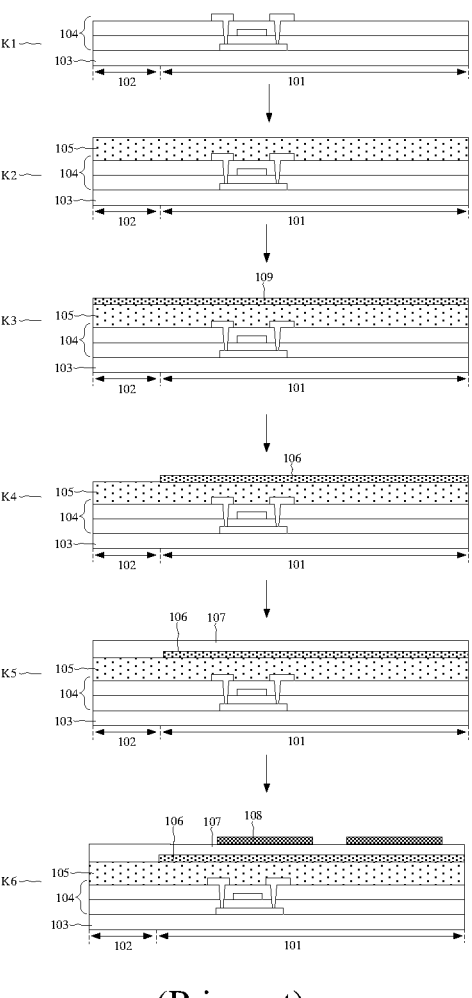
FIG. 2 is a flowchart of a method for manufacturing a display panel of the prior art.

Referring to FIG. 2, FIG. 2 is a flowchart of a method for manufacturing a display panel in a related art, in which a manufacturing process of the display panel with such a structure includes following steps.

Step K1: a transistor layer 104 is formed on the substrate 103.

Step K2: an organic layer 105 is formed on the transistor, in which the organic layer 105 is an organic film, and the organic layer 105 covers the display area 101 and the non-display area 102 to achieve flatness of layers at various positions.

Step K3: a first electrode layer 109 is formed on the organic layer 105.

Step K4: the first electrode layer 109 is etched to form the first electrode 106 located in the display area 101.

Step K5: an electrode insulation layer 107 is formed on the first electrode 106.

Step K6: a second electrode 108 in the display area 101 is formed on the electrode insulation layer 107.

As can be seen from the above manufacturing processes, after forming the organic layer 105 in step K2 and before forming the first electrode layer 109 in step K3, and after etching to form the first electrode layer 106 in step K4 and before forming the electrode insulation layer 107 in step K5, the portion of the organic layer 105 in the non-display area 102 is always exposed to the outside, and ambient water vapor can directly contact this portion of the organic layer 105, resulting in the portion of the organic layer 105 to absorb a large amount of moisture. When subsequently subjected to higher processing temperatures, the portion of the moisture absorbed by the organic film 105 may be released, thereby causing the upper layer to bulge.

In this regard, the present disclosure provide a display panel, which can effectively reduce the moisture absorbed by the organic layer during the manufacturing process, and at the same time, the gas generated by the organic layer itself and the moisture absorbed during the manufacturing process can also be released, thereby effectively improving subsequent layer detachment problem.

Figure 3:
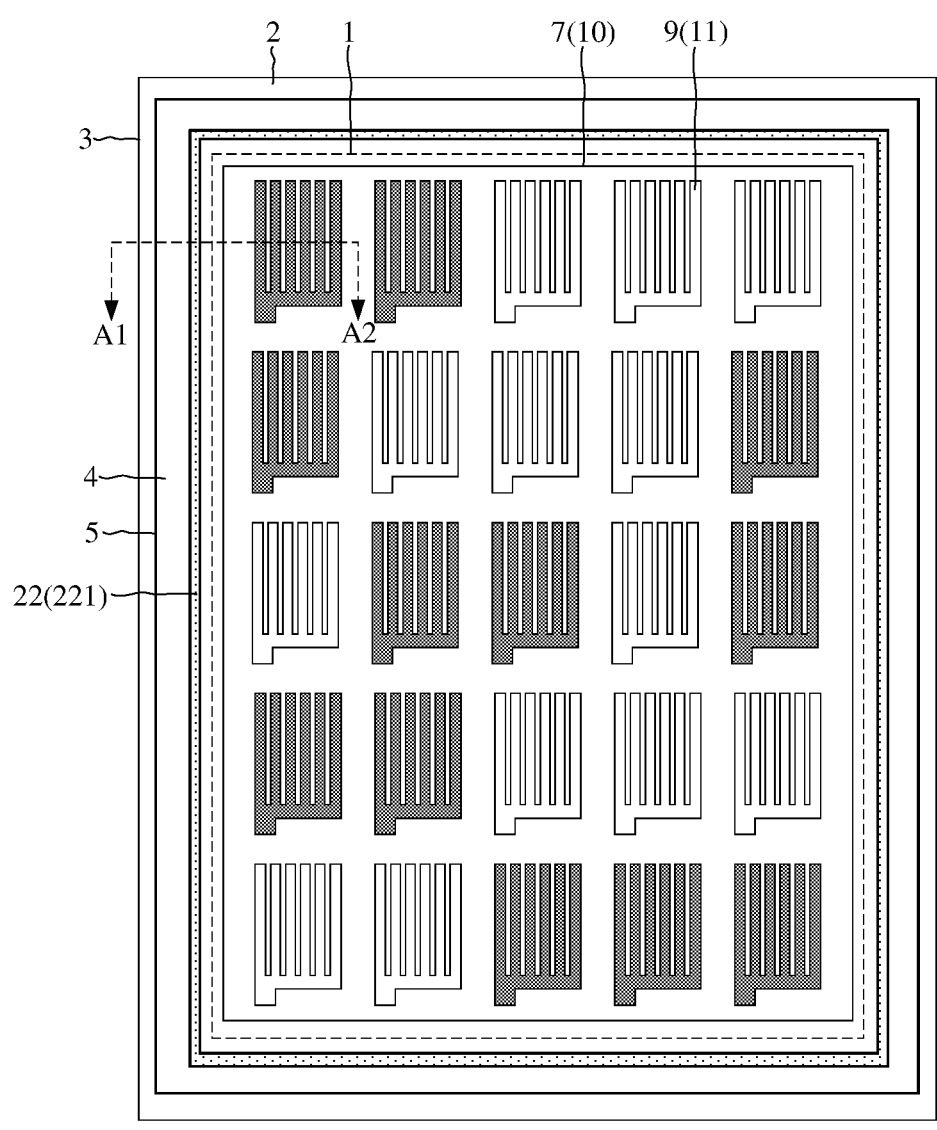
FIG. 3 is a top view of a display panel according to an embodiment of the present disclosure.
Figure 4:
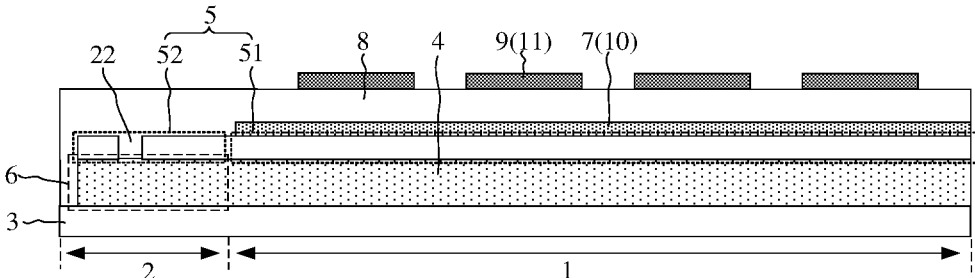
FIG. 4 is a cross-sectional view taken along line A1-A2 of FIG. 3 according to an embodiment of the present disclosure.

FIG. 3 is a top view of a display panel according to an embodiment of the present disclosure; and FIG. 4 is a cross-sectional view taken along line A1-A2 of FIG. 3 according to an embodiment of the present disclosure. As shown in FIG. 3 and FIG. 4, the display panel includes a display area 1 and a non-display area 2. The display area 1 is an image display area of the display panel, also referred to as an AA (Active Area) area. The display panel further includes a substrate 3, an organic layer 4, and an organic layer protection structure 5.

The organic layer 4 is located at a side of the substrate 3 and located in the display area 1 and the non-display area 2. The organic layer 4 may be a planarization layer for achieving layer planarization of a display panel. The organic layer 4 includes a first portion 6 in the non-display area 2.

The organic layer protection structure 5 is located on a surface of the organic layer 4 facing away from the substrate 3. The organic layer protection structure 5 includes a first structure 51 in the display area 1 and a second structure 52 in the non-display area 2. In a direction perpendicular to a plane of the substrate 3, the second structure 52 overlaps the first portion 6, and the first structure 51 and the second structure 52 are in direct contact with the organic film layer 4. The organic layer protection structure 5 includes a hollow structure 22. The hollow structure 22 may be a via hole penetrating the organic layer protection structure 5.

It should be noted that, in the embodiments of the present disclosure, the organic layer protective structure 5 is the earliest layer formed after the organic layer 4 is formed. That is to say, there is no other process steps in the display panel after the formation of the organic layer 4 and before the formation of the organic layer protection structure 5.

Based on the structure of the display panel provided by the embodiments of the present disclosure, during the manufacturing process of the display panel, after forming the organic layer 4, a film forming process is first used to form an organic layer protection structure 5 capable of shielding the organic layer 4. In this way, when other layers are subsequently formed, this portion of the organic layer 4 that is shielded is not re-exposed. At this time, the organic layer 4 is only exposed for a short time after the organic layer 4 is formed and before the organic layer protection structure 5 is formed, so that the duration of the exposure of the organic layer protection structure 5 during the whole manufacturing process is reduced, in particular the duration of the exposure of the first portion 6 of the organic layer 4 is reduced. Furthermore, the organic layer protection structure 5 may also block water and oxygen from entering the organic layer 4 during other subsequent manufacturing processes, thereby significantly reducing moisture absorbed by the organic layer 4 during the manufacturing process of the display panel.

As mentioned above, the organic layer 4 is usually formed by a coating process in which bubbles are easily generated. In the embodiments of the present disclosure, by providing the hollow structure 22 in the organic layer protection structure 5, the hollow structure 22 can be further utilized to release the water vapor decomposed, absorbed and generated in subsequent high-temperature process by the organic layer 4 itself, thereby reducing or eliminating the layer detachment.

Figure 5:
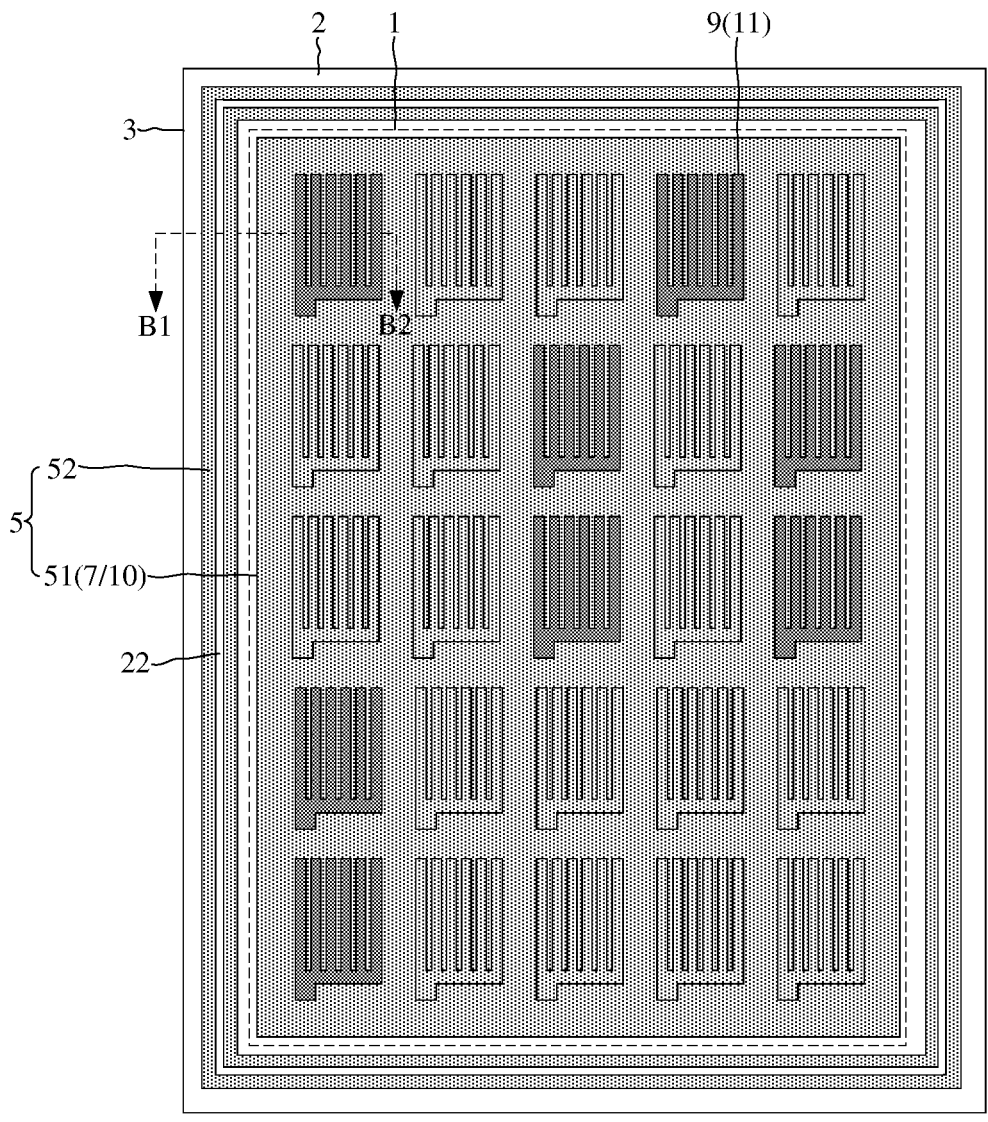
FIG. 5 is a top view of a display panel provided by another embodiment of the present disclosure.
Figure 6:
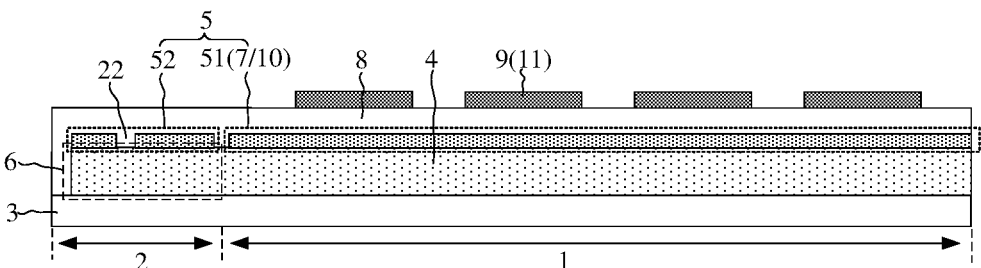
FIG. 6 is a cross-sectional view taken along line B1-B2 of FIG. 5 according to an embodiment of the present disclosure.

FIG. 5 is a top view of a display panel provided by another embodiment of the present disclosure; and FIG. 6 is a cross-sectional view taken along line B1-B2 of FIG. 5 according to an embodiment of the present disclosure. In an embodiment, as shown in FIG. 5 and FIG. 6, the display panel further includes a first electrode 7 provided in the display area 1, and the first electrode 7 is provided on a surface of the organic layer 4 facing away from the substrate 3. The organic layer protection structure 5 includes a conductive material, and the first structure 51 of the organic layer protection structure 5 is a first electrode.

Figure 30:
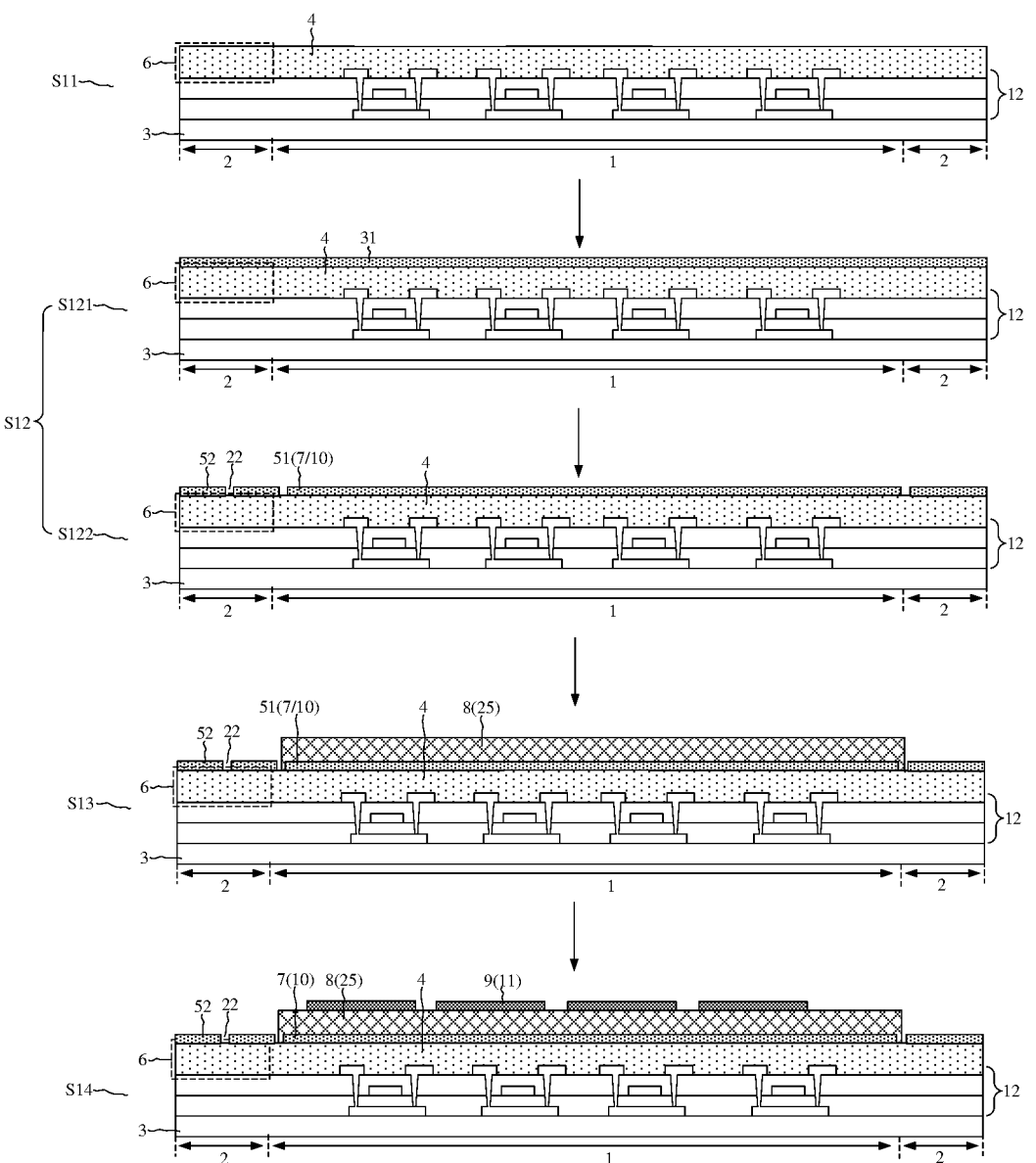
FIG. 30 is a flowchart of a method for manufacturing a display panel according to an embodiment of the present disclosure.

Based on the above structures, in conjunction with FIG. 30, in the manufacturing process of the display panel, after the organic layer 4 is formed, a protection layer 31 is firstly formed on the organic layer 4, and the first structure 51 (the first electrode 7) in the display area 1 and the second structure 52 in the non-display area 2 are formed simultaneously by etching the protection layer 31. In this way, since the first structure is the first electrode 7 in the display panel, on the one hand, the first electrode 7 and the second structure 52 are formed together during the manufacturing process, at this time, only the pattern of the mask corresponding to the original first electrode 7 need be adjusted without adding additional processes, the manufacturing process of the display panel is easier, and on the other hand, the first electrode 7 and the first structure 51 need only occupy one layer thickness, and it is more advantageous to achieve the light-thin design of the display panel.

Further, referring again to FIGS. 5 and 6, the display panel also includes an electrode insulation layer 8 on the side of the first electrode 7 facing away from the substrate 3 and a second electrode 9 on the side of the electrode insulation layer 8 facing away from the substrate 3. The first electrode 7 is a common electrode 10, and the second electrode 9 is a pixel electrode 11.

When the display panel is displaying images, a common voltage is transmitted on the whole common electrode 10, but the pixel electrodes 11 corresponding to different sub-pixels need to transmit specific driving voltages according to the brightness corresponding to the sub-pixels, i.e., the voltages transmitted on different pixel electrodes 11 may be the same or different. In the present disclosure, by providing the first electrode 7 in a same layer as the second structure 52 to be the common electrode 10, even if the second structure 52 is in contact with the first electrode 7 due to process errors, so that the voltages transmitted on the first electrode 7 is not affected, without affecting light-emitting reliability of sub-pixels.

Figure 7:
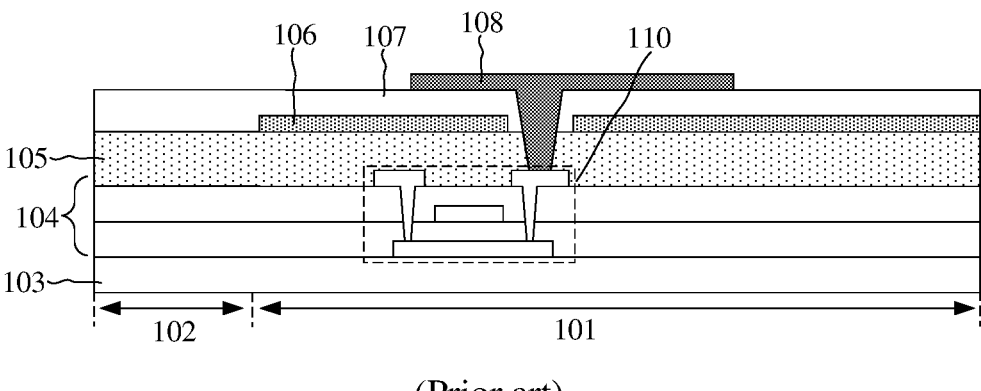
FIG. 7 is a structural schematic diagram of layers of a display panel of the prior art.

FIG. 7 is a structural schematic diagram of layers of a display panel in a related art. In the traditional design, when the first electrode 106 is the common electrode and the second electrode 108 is the pixel electrode, in order to achieve electrical connection between the second electrode 108 and the transistor 110 in the transistor layer 104, via holes are required to be provided on the organic layer 105, the first electrode 106 and the electrode insulation layer 107, respectively. The via holes in these three layers overlap to form a T-shaped via hole with a large depth. With such a design, after forming via holes on the first electrode 106 and after forming the via hole on the electrode insulation layer 107, all sidewalls of the via holes in the organic layer 105 are exposed to the outside, resulting in a longer exposure time of the via holes in the organic layer 105. Therefore, more water vapor may penetrate the organic layer 105 from the sidewall of the via hole.

Figure 8:
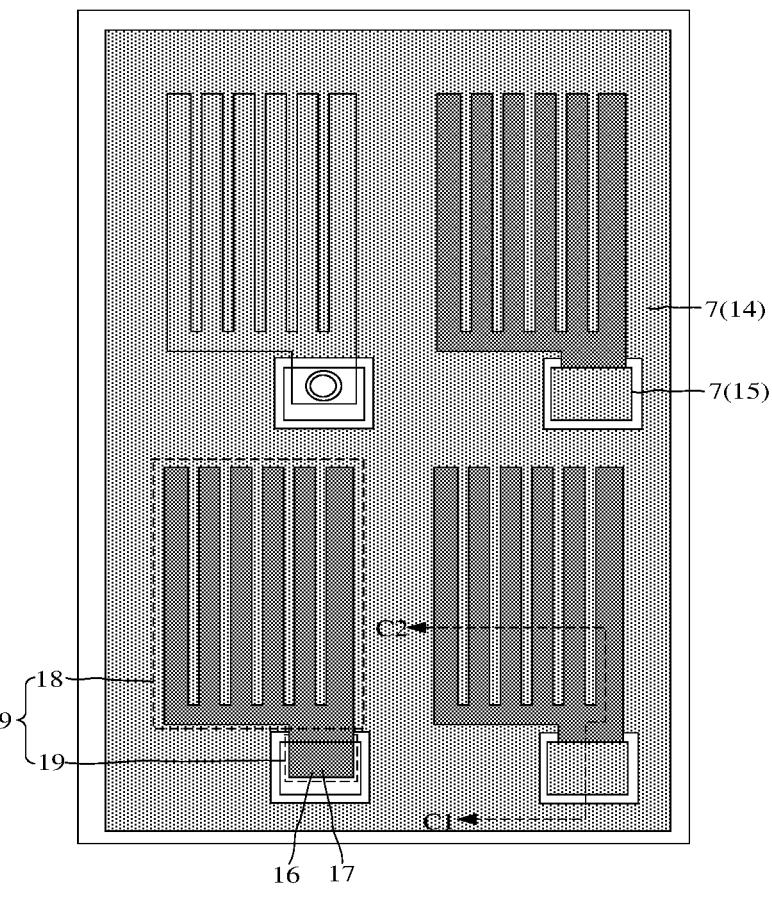
FIG. 8 is a partial top view of a display panel according to an embodiment of the present disclosure.
Figure 9:
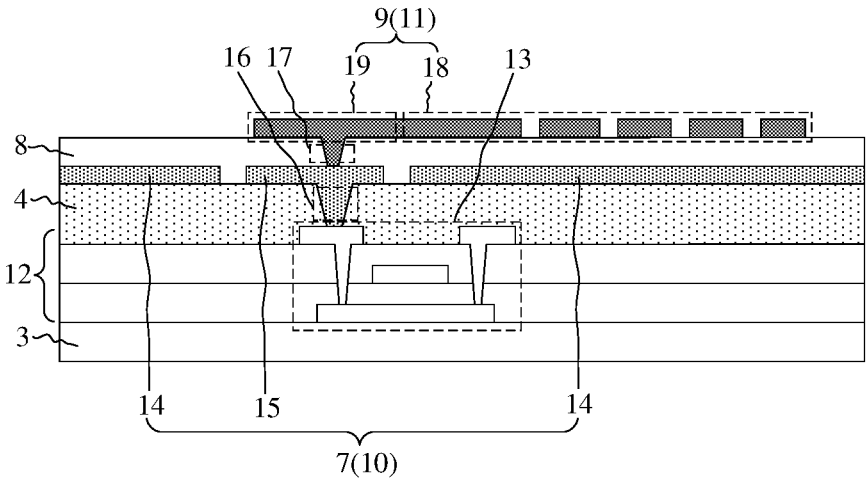
FIG. 9 is a cross-sectional view taken along line C1-C2 of FIG. 8 according to an embodiment of the present disclosure.
Figure 10:
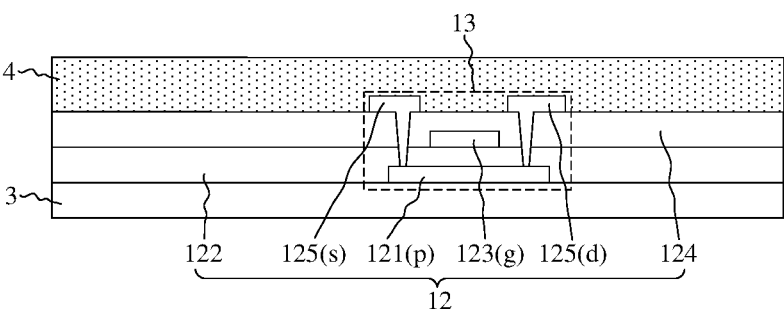
FIG. 10 is a structural schematic diagram of a transistor layer according to an embodiment of the present disclosure.

FIG. 8 is a partial top view of a display panel according to an embodiment of the present disclosure, and FIG. 9 is a cross-sectional view taken along line C1-C2 of FIG. 8 according to an embodiment of the present disclosure. As shown in FIGS. 8 and 9, the display panel further includes a transistor layer 12 located between the substrate 3 and the organic layer 4. The transistor layer 12 includes a first transistor 13. As shown in FIG. 10, which is a structural schematic diagram of a transistor layer according to an embodiment of the present disclosure, the transistor layer 12 may include a semiconductor layer 121, a gate insulation layer 122 located at a side of the semiconductor layer 121 facing away from the substrate 3, a first metal layer 123 located at a side of the gate insulation layer 122 facing away from the substrate 3, an interlayer dielectric layer 124 located at a side of the first metal layer 123 facing away from the substrate 3, and a second metal layer 125 located at a side of the interlayer dielectric layer 124 facing away from the substrate 3. The semiconductor layer 121 is configured to form the active layer p of the first transistor 13. The first metal layer 123 is configured to form the gate electrode g of the first transistor 13. The second metal layer 125 is configured to form the source electrode s and the drain electrode d of the first transistor 13.

Referring to FIGS. 8 and 9, the first electrode 7 includes a first body 14 and a plurality of first connection portions 15 that are provided in a same layer and electrically insulated from each other, i.e., the first body 14 and the first connection portion 15 are independent of each other and have a spacing therebetween. The organic layer 4 includes a first via hole 16 through which the first connection portion 15 is electrically connected to the first transistor 13.

The second electrode 9 includes a second body 18 and a second connection portion 19 protruding from the second body 18. The electrode insulation layer 8 includes a second via hole 17 through which the second connection portion 19 is electrically connected to the first connection portion 15.

In this way, by dividing the first electrode 7 (the common electrode 10) into the first body 14 and the plurality of first connection portions 15 that are independent from each other, the first connection portions 15 may serve as an auxiliary connection layer between the second electrode 9 and the first transistor 13. At this time, the first connection portion 15 is recessed in the first via hole 16 of the organic layer 4, and the first via hole 16 is completely covered, thereby preventing the first via hole 16 from being exposed in the following manufacturing process, reducing the exposure time of the first via hole 16, thereby reducing the risk of moisture penetrating the organic layer 4 through the sidewall of the first via hole 16, and reducing the gas released by the organic layer 4 to a greater extent.

In addition, by providing the second connection portion 19 of the second electrode 9 (the pixel electrode 11) to protrude from one side of the second body 18, and overlapping the first connection portion 15 with the second connection portion 19, it is possible to minimize the influence of on a direct facing area between the second electrode 9 and the first electrode 7 by providing the first connection portion 15. In this way, it is possible to have a direct facing area that is continuous and has a large area between the second electrode 9 and the first electrode 7, and it is advantageous to form a uniform electric field, thereby optimizing the display effect.

Figure 11:
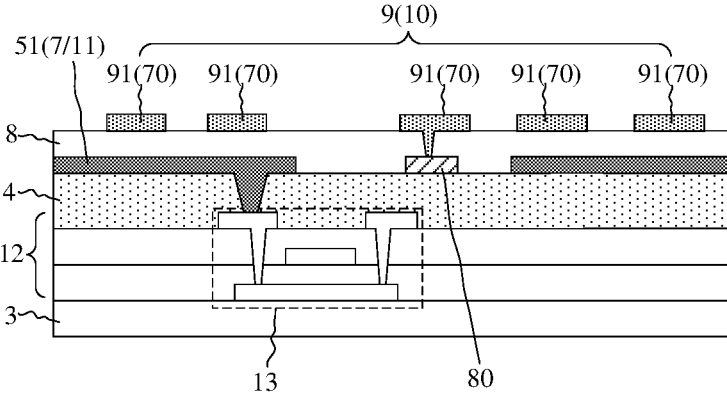
FIG. 11 is a structural schematic diagram of a display panel according to another embodiment of the present disclosure.

FIG. 11 is a structural schematic diagram of a display panel according to another embodiment of the present disclosure. In an embodiment, as shown in FIG. 11, the display panel further includes an electrode insulation layer 8 and a second electrode 9. The electrode insulation layer 8 is located at a side of the first electrode 7 facing away from the substrate 3, and the second electrode 9 is located at a side of the electrode insulation layer 8 facing away from the substrate 3.

The first electrode 7 is the pixel electrode 11, and the second electrode 9 is the common electrode 10. The common electrode 10 includes a plurality of sub-electrodes 91 spaced apart from each other. The sub-electrode 91 is reused with the touch electrodes 70, and is electrically connected to the touch signal line 80.

In the above structure, the first structure 51 of the organic layer protection structure 5 is reused with the pixel electrode 11, while the common electrode 10 is provided at a side closer to the light-emitting surface of the display panel. In this way, by patterning design of the common electrode 10, the common electrode 10 includes a plurality of sub-electrodes 91 spaced apart from each other, and the sub-electrode 91 is reused with the touch electrode 70. At this time, a driving process of the display panel may include a display period and a touch period. In the display period, the touch signal line 80 transmits a common voltage to the sub-electrode 91 to form an electric field between the sub-electrode 91 and the pixel electrode 11, so as to drive the liquid crystal molecules to rotate. In the touch period, the sub-electrode 91 transmits the sensed detection signal to the touch signal line 80 to determine the touch position of the finger according to the detection signal fed back.

Since the sub-electrode 91 (touch electrode 70) is located at a side closer to the light-emitting surface of the display panel, the sub-electrode 91 is located closer to the finger, and the sub-electrode 91 is better able to sense the signal variation caused by the touch of the finger, thereby effectively improving the touch detection accuracy.

When the first electrode 7 is the pixel electrode 11, a distance between the second structure 52 and the first electrode 7 (the pixel electrode 11) may be greater than 3 μm, so as to prevent the second structure 52 and the pixel electrodes 11 from being in contact with each other due to process accuracy and so on, and further prevent the signals transmitted on the plurality of pixel electrodes 11 from interfering with each other.

Figure 12:
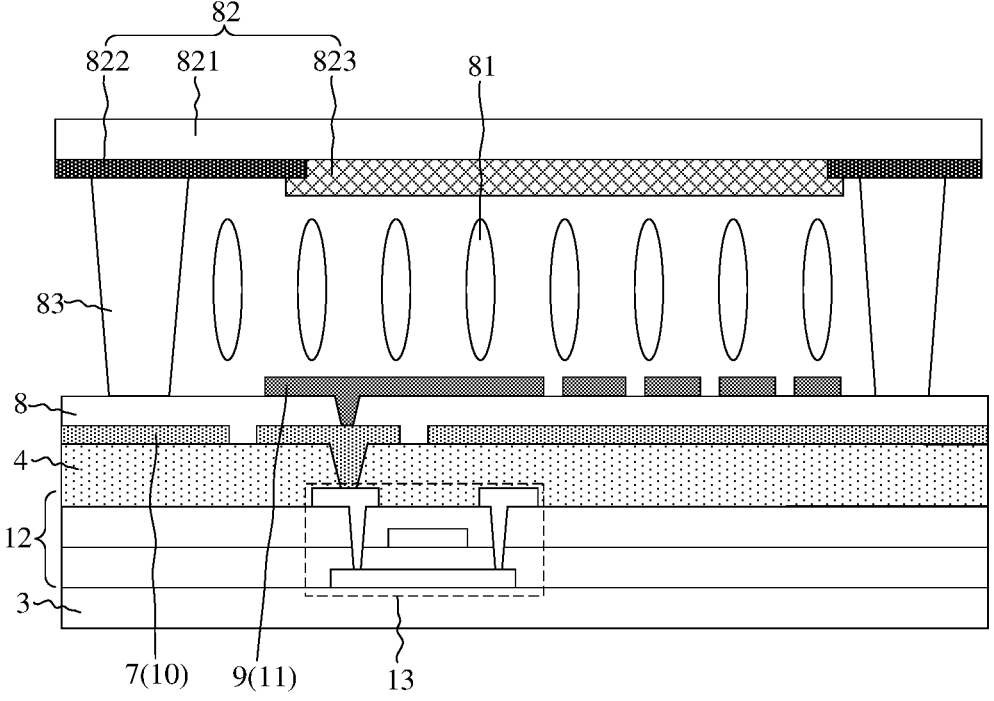
FIG. 12 is a structural schematic diagram of a display panel according to another embodiment of the present disclosure.

When the display panel includes the common electrode 10 and the pixel electrode 11, the display panel may be a liquid crystal display panel. FIG. 12 is a structural schematic diagram of a display panel according to another embodiment of the present disclosure. As shown in FIG. 12, the display panel further includes liquid crystal molecules 81, a color film substrate 82, and support posts 83. The liquid crystal molecules 81 and the support posts 83 are located between the second electrode 9 and the color film substrate 82. The support posts 83 are configured to support the color film substrate 82 to form a uniform cell thickness. The color film substrate 82 may include a substrate 821, a black matrix 822 located at a side of the substrate 821 facing the liquid crystal molecules 81, and a color film 823. The color film 823 is configured to achieve color conversion of light. The black matrix 822 is configured to define a light exit area of the display panel.

In addition, when the first electrode 7 is the common electrode 10 or the pixel electrode 11, the conductive material for forming the organic layer protection structure 5 may be indium tin oxide (ITO). In addition to having good electrical conductivity, ITO has a higher water-oxygen barrier property, thereby better shielding the organic layer 4 from water vapor penetration into the organic layer 4 during the manufacturing process.

Figure 13:
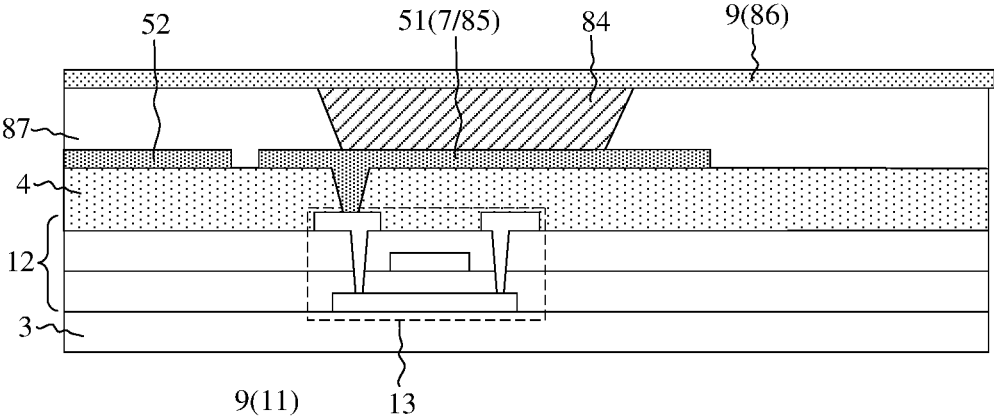
FIG. 13 is a structural schematic diagram of a display panel according to another embodiment of the present disclosure.

In an embodiment, the display panel provided by the embodiments of the present disclosure may also be an Organic Light-Emitting Diode (OLED) display panel. FIG. 13 is a structural schematic diagram of a display panel according to another embodiment of the present disclosure. As shown in FIG. 13, the display panel further includes a light-emitting layer 84 and a second electrode 9. The light-emitting layer 84 is located at a side of the first electrode 7 facing away from the substrate 3. The second electrode 9 is located at a side of the light-emitting layer 84 facing away from the substrate 3. The first electrode 7 is an anode 85, and the second electrode 9 is a cathode 86. In addition, the display panel further includes a pixel definition layer 87 located at a side of the first electrode 7 facing away from the substrate 3. The pixel definition layer 87 includes an opening in which the light-emitting layer 84 is located.

In this configuration, the first structure 51 of the organic layer protection structure 5 is reused for the anode 85 in the organic light emitting diode. In the display panel, the second structure 52 of the organic layer protection structure 5 may be formed of the same material and layer as the anode 85, thereby simplifying the manufacturing process of the display panel. In addition, when the first electrode 7 is the anode 85, the organic layer protection structure 5 may be a structure laminated by a plurality of layers, such as an ITO-Ag-ITO laminate structure.

In an embodiment, referring again to FIGS. 3 and 4, the display panel further includes a first electrode 7 located in the display area 1. The first electrode 7 is located at a side of the organic layer 4 facing away from the substrate 3. The organic layer protection structure 5 is located between the organic layer 4 and the first electrode 7, and covers the organic layer 4 in a direction perpendicular to a plane of the substrate 3.

In such a structure, after the organic layer 4 is formed and before the first electrode 7 is formed, the present disclosure utilizes a separate film forming process to form the organic layer protective structure 5. By covering the organic layer 4 with the organic layer protective structure 5, the complete coverage of the organic layer 4 can be achieved, thereby protecting the entirety of the organic layer 4, while reducing the exposure time of the entirety of the organic layer 4. Meanwhile, penetration of water oxygen into the organic layer protective structure 5 is avoided or reduced in subsequent other manufacturing processes, thereby reducing the moisture absorbed by the organic layer 4 in the manufacturing process of the display panel.

Figure 14:
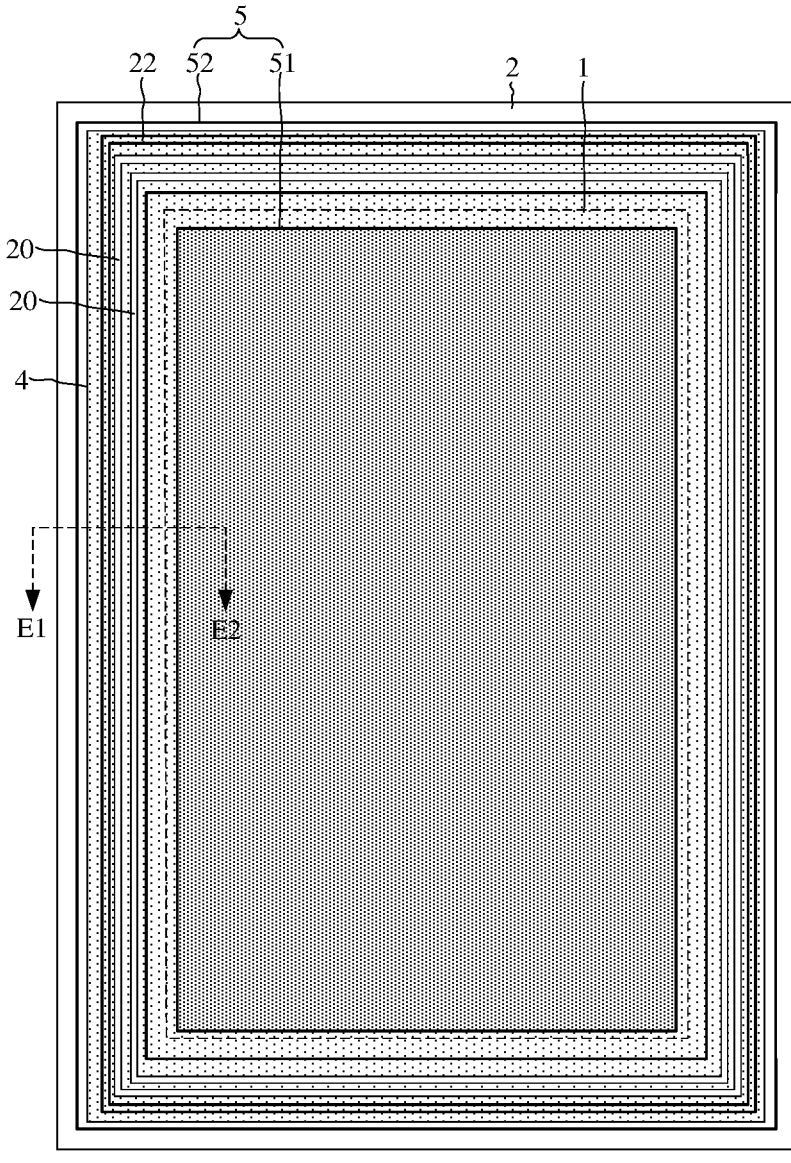
FIG. 14 is a top view of a display panel according to another embodiment of the present disclosure.
Figure 15:
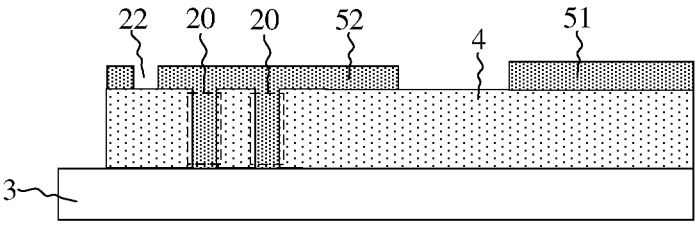
FIG. 15 is a cross-sectional view taken along line E1-E2 of FIG. 14 according to an embodiment of the present disclosure.

FIG. 14 is a top view of a display panel according to another embodiment of the present disclosure, and FIG. 15 is a cross-sectional view taken along line E1-E2 of FIG. 14 according to an embodiment of the present disclosure. As shown, the first portion 6 includes a groove 20. The groove 20 may be an annular groove around the display area 1, to block ambient water vapor penetrating into the display area 1. In the present disclosure, the second structure may cover the groove 20 in a direction perpendicular to the plane of the substrate 3, so that the organic layer protective structure 5 shields the sidewall of the groove 20, reducing the exposed area of the first portion 6 to more greatly reduce the moisture absorbed by the organic layer 4.

Figure 16:
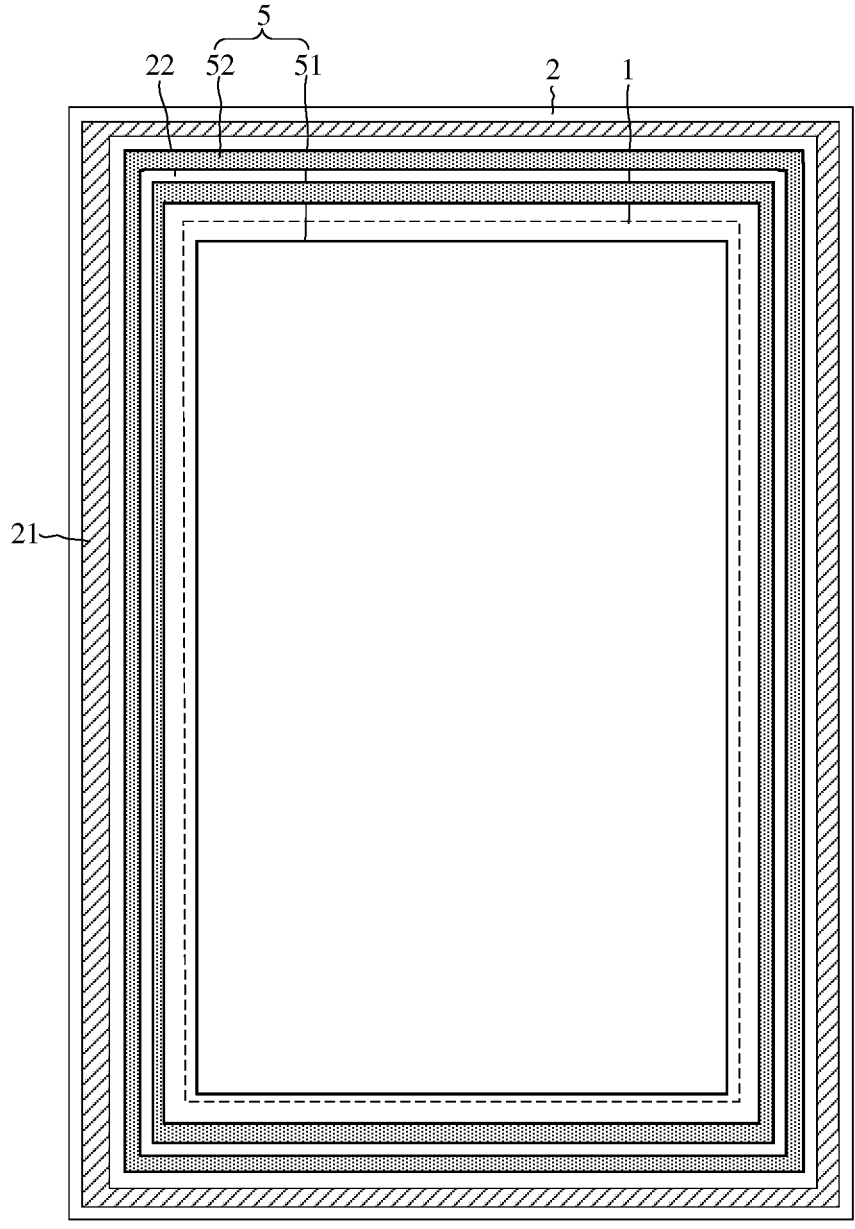
FIG. 16 is a top view of a display panel according to another embodiment of the present disclosure.

In an embodiment, as shown in FIG. 16, which is a top view of a display panel according to another embodiment of the present disclosure, the display panel further includes a sealant 21 provided in the non-display area 2. In a direction perpendicular to the plane of the substrate 3, the organic layer protective structure 5 is provided at a side of the sealant 21 facing the display area 1, so that a distance between the organic layer protective structure 5 and a cutting edge of the display panel is increased, thereby avoiding penetration of static electricity into the interior of the display panel through the organic layer protective structure 5.

In an embodiment, in the direction perpendicular to the plane of the substrate 3, an area A of an orthogonal projection of the organic layer protective structure 5 and a total area B of the hollow structure 22 satisfy:

$$5.19\% \leq \frac{B}{A} \leq 16.8\%.$$

If a proportion of the total area of the hollow structure 22 is too large, the shielding effect of the organic layer protection structure 5 on the first portion 6 is affected, resulting in a large area of the first portion 6 being exposed by the hollow structure 22, thereby further absorbing a large amount of moisture through the hollow structure 22. If a proportion of the total area of the hollow structure 22 is too small, the release effect of subsequent moisture within the first portion 6 is not apparent, so that the residual moisture in the first portion 6 cannot be released. In an embodiment, by arranging a proportion of the total area of the hollow structure 22 to be in a range from 5.19% to 16.8%, the shielding effect of the organic layer protective structure 5 on the first portion 6 can be enhanced to reduce the moisture absorbed by the first portion 6, and the outgassing effect can be enhanced.

Figure 17:
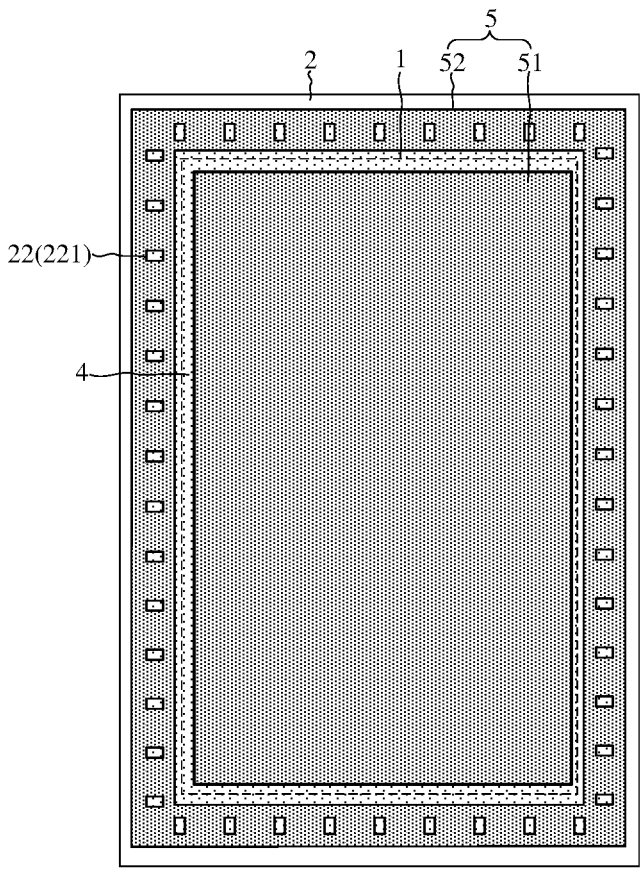
FIG. 17 is a top view of a display panel according to another embodiment of the present disclosure.

In an embodiment, as shown in FIG. 17, which is a top view of a display panel according to another embodiment of the present disclosure, the hollow structure 22 includes a plurality of first hollow structures 221 located in the second structure 52. The plurality of first hollow structures 221 may be arranged along the extending direction of the edge of the display area 1 in order to achieve all-around outgassing of the first portion 6.

In an embodiment, referring again to FIG. 3, the hollow structure 22 includes a first hollow structure 221 located in the second structure 52. The first hollow structure 221 is an annular structure surrounding the display area 1, so as to degas the first portion 6, so that more water vapor is released.

Figure 18:
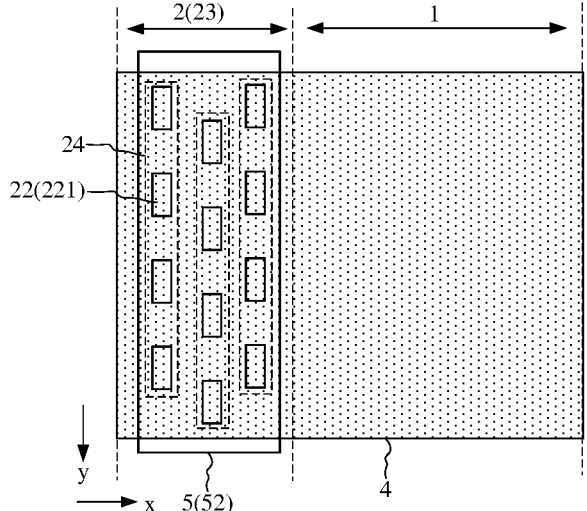
FIG. 18 is a schematic diagram showing an arrangement of hollow structures according to an embodiment of the present disclosure.

In an embodiment, as shown in FIG. 18, which is a schematic diagram showing an arrangement of hollow structures 22 according to an embodiment of the present disclosure, the non-display area 2 includes a first non-display area 23. A direction from the first non-display area 23 to the display area 1 is a first direction x. The hollow structure 22 includes a plurality of first hollow structures 221 located in the second structure 52. The second structure 52 includes at least two hollow groups 24 located in the first non-display area 23. The at least two hollow groups 24 are arranged along the first direction x. The hollow group 24 include a plurality of first hollow structures 221 arranged along a second direction y. The first hollow structures 221 in adjacent two hollow groups 24 are staggered in the first direction x. The first direction x intersects the second direction y. By staggering the first hollow structures 221, the first hollow structure 221 can provide a uniform degassing of the first portion 6 to optimize the degassing effect.

Figure 19:
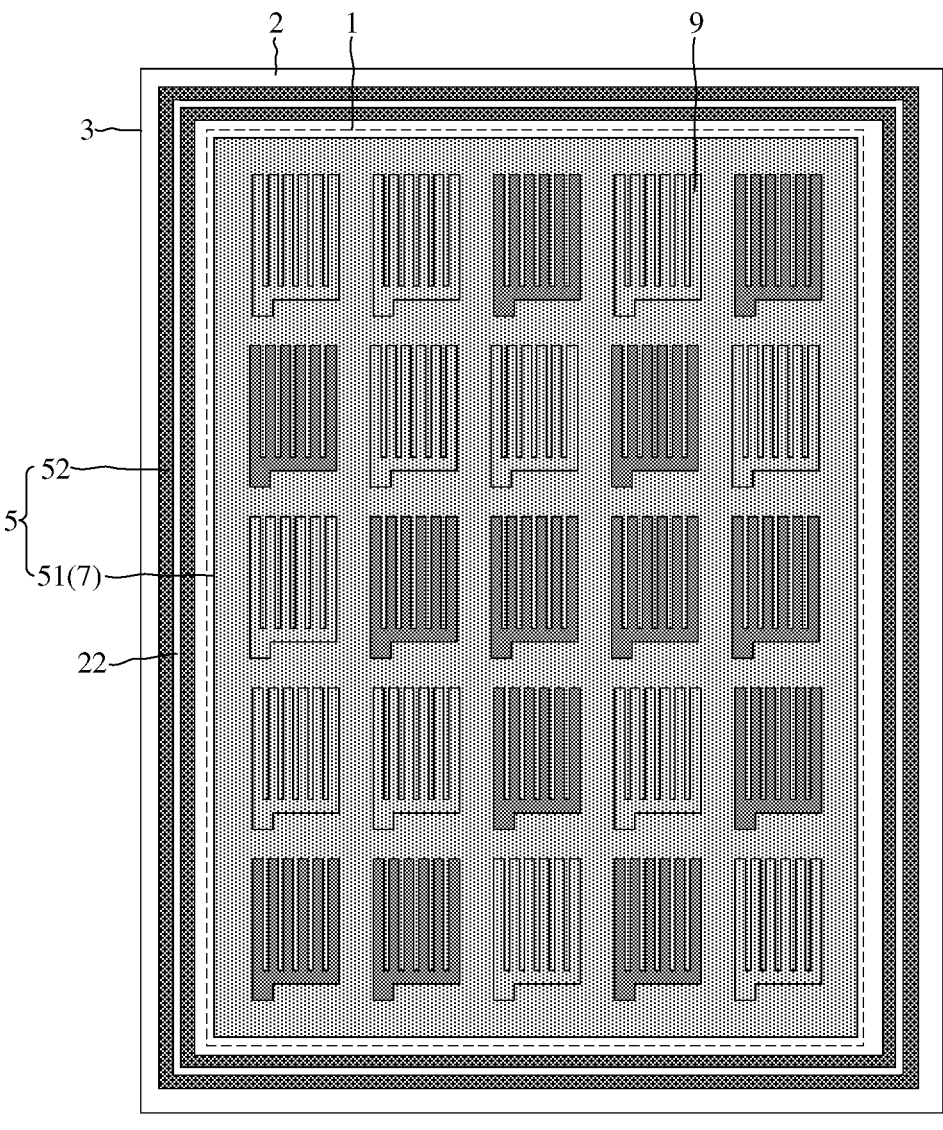
FIG. 19 is a top view of a display panel according to another embodiment of the present disclosure.

In an embodiment, as shown in FIG. 19, which is a top view of a display panel according to another embodiment of the present disclosure, the second structure 52 is formed of silicon nitride. Since silicon nitride has better anti-moisture and anti-static properties, forming the second structure 52 by silicon nitride can make the display panel have better anti-moisture and anti-static properties.

In addition, when the second structure 52 is formed of silicon nitride, as mentioned above, the first structure 51 can be reused into the first electrode 7. The first electrode 7 can be the common electrode 10, the pixel electrode 11 or the anode 85, at this time, the first structure 51 and the second structure 52 are formed of different materials.

Figure 20:
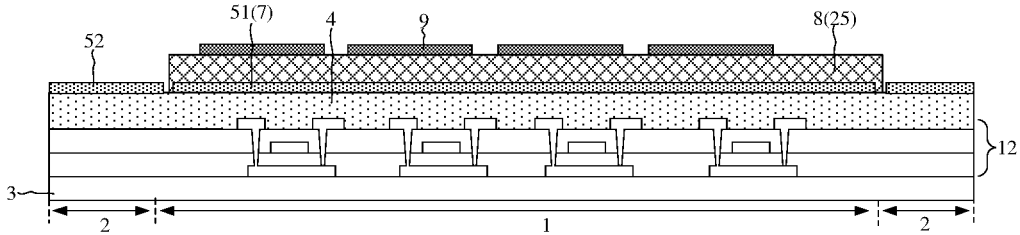
FIG. 20 is a structural schematic diagram of layers of a display panel according to another embodiment of the present disclosure.

In an embodiment, as shown in FIG. 20, which is a structural schematic diagram of layers of a display panel according to another embodiment of the present disclosure, the display panel further includes a first electrode 7, an electrode insulation layer 8 and a second electrode 9. The first electrode 7 is located at a side of the organic layer 4 facing away from the substrate 3. The electrode insulation layer 8 is located at a side of the first electrode 7 facing away from the substrate 3. The second electrode 9 is located at a side of the electrode insulation layer 8 facing away from the substrate 3.

The electrode insulation layer 8 includes a first insulation portion 25 located in the display area 1. The forming material of first insulation portion 25 includes silicon oxide.

In a traditional panel structure, the electrode insulation layer 8 between the first electrode 7 and the second electrode 9 is usually formed of silicon nitride, but the silicon nitride film, due to its low film forming temperature, has a low lateral migration rate of the particles, and the particles are easily pressed, and thus the residual stress is large, and film detachment can easily occur.

In an embodiment, the first insulation portion 25 of the electrode insulation layer 8 is formed of silicon oxide. As can be seen from Table 1, the thermal expansion coefficient of silicon oxide is smaller than the thermal expansion coefficient of silicon nitride, and the Young's modulus of silicon oxide is also smaller than the Young's modulus of silicon nitride.

TABLE 1

| Thermal | Substrate (Glass) | $3.17 \times 10^{-6}$/K | Young's | Substrate (Glass) | 69.3 GPa |
|---|---|---|---|---|---|
| Expansion | Silicon Oxide | $0.5 \times 10^{-6}$/K | Modulus | Silicon Oxide | 73 GPa |
| Coefficient | Silicon Nitride | $3 \times 10^{-6}$/K | | Silicon Nitride | 250 GPa |
| | Organic Layer (Organic Material) | $3 \times 10^{-5}$/K | | Organic Layer (Organic Material) | 1.66 GPa |
| | First Electrode (Indium Tin Oxide) | $4.37 \times 10^{-5}$/K | | First Electrode (Indium Tin Oxide) | 158.7 GPa |

Figure 21:
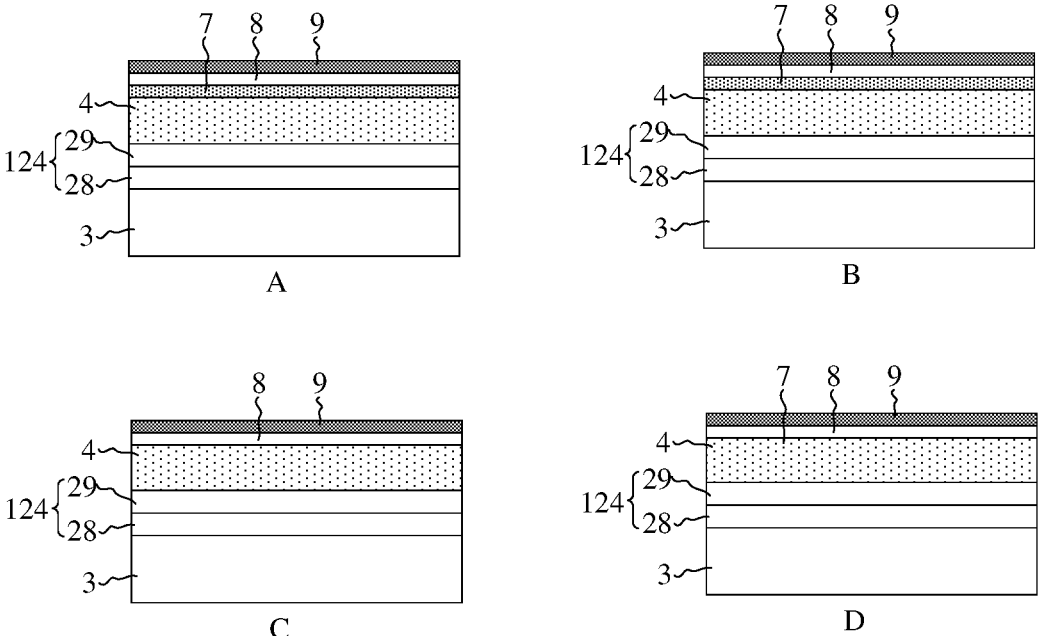
FIG. 21 is a structural schematic diagram of four layer structures according to an embodiment of the present disclosure.

To this end, the inventors have further verified that, as shown in FIG. 21, which is a structural schematic diagram of four layer structures according to an embodiment of the present disclosure, the present disclosure provides four types of layer structures.

In a first-type layer structure A, the first-type layer structure A includes a substrate 3, an interlayer dielectric layer 124, an organic layer 4, a first electrode 7, an electrode insulation layer 8, and a second electrode 9. The electrode insulation layer 8 is formed of silicon oxide. The interlayer dielectric layer 124 includes a first dielectric layer 28 formed of silicon oxide, and a second dielectric layer 29 formed of silicon nitride.

In the second-type layer structure B, the second-type layer structure B includes a substrate 3, an interlayer dielectric layer 124, an organic layer 4, a first electrode 7, an electrode insulation layer 8, and a second electrode 9. The electrode insulation layer 8 is formed of silicon nitride. The interlayer dielectric layer 124 includes a first dielectric layer 28 formed of silicon oxide, and a second dielectric layer 29 formed of silicon nitride.

In the third-type layer structure C, the third-type layer structure C includes a substrate 3, an interlayer dielectric layer 124, an organic layer 4, an electrode insulation layer 8, and a second electrode 9. The electrode insulation layer 8 is formed of silicon oxide. The interlayer dielectric layer 124 includes a first dielectric layer 28 formed of silicon oxide, and a second dielectric layer 29 formed of silicon nitride.

In the fourth-type layer structure D, the fourth-type layer structure D includes a substrate 3, an interlayer dielectric layer 124, an organic layer 4, an electrode insulation layer 8 and a second electrode 9. The electrode insulation layer 8 is formed of silicon nitride. The interlayer dielectric layer 124 includes a first dielectric layer 28 formed of silicon oxide, and a second dielectric layer 29 formed of silicon nitride.

The thickness of each layer in the four types of layer structures is shown in Table 2.

TABLE 2

| | First-type Layer structure A | | Second-type Film Layer Structure B | | Third-type Layer structure C | | Fourth-type Film Layer Structure D | |
|---|---|---|---|---|---|---|---|---|
| Layer Thickness (mm) | Substrate | 0.5 | Substrate | 0.5 | Substrate | 0.5 | Substrate | Substrate |
| | Inter-Layer | SiO$_2$ 0.0003 | Inter-Layer | SiO$_2$ 0.0003 | Inter-Layer | SiO$_2$ 0.0003 | Inter-Layer | Inter-Layer |
| | Dielectric Layer | SiN$_x$ 0.0002 | Dielectric Layer | SiN$_x$ 0.0002 | Dielectric Layer | SiN$_x$ 0.0002 | Dielectric Layer | Dielectric Layer |
| | Organic Layer | 0.0022 | Organic Layer | 0.0022 | Organic Layer | 0.0022 | Organic Layer | Organic Layer |
| | First electrode | 0.00005 | First electrode | 0.00005 | | | / | |
| | Electrode Insulation Layer | 0.00007 | Electrode Insulation Layer | 0.0001 | Electrode Insulation Layer | 0.00007 | Electrode Insulation Layer | 0.0001 |
| | Second Electrode | 0.00005 | Second Electrode | 0.00005 | Second Electrode | 0.00005 | Second Electrode | 0.00005 |

Figure 22:
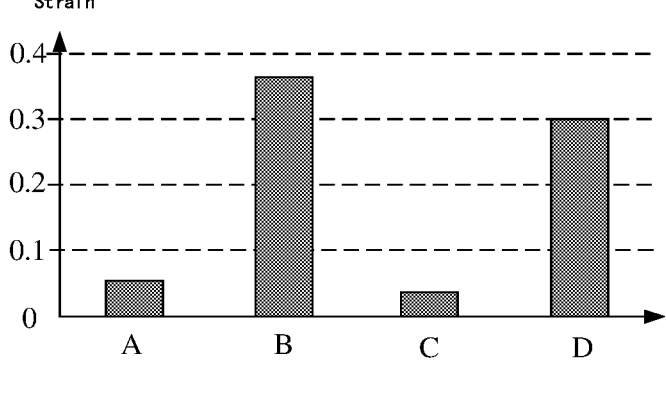
FIG. 22 is a histogram of the strain of an electrode insulation layer according to an embodiment of the present disclosure.

As shown in FIG. 22, which is a histogram of the strain of an electrode insulation layer according to an embodiment of the present disclosure, it can be seen from the histogram that the strain of the electrode insulation layer 8 in the first-type layer structure A and the third-type layer structure C is small, i.e., when the electrode insulation layer 8 is formed of silicon oxide, the strain of the electrode insulation layer 8 can be greatly reduced, and thus the risk of detachment is low, so that the first electrode 7 and the second electrode 8 can normally form an electric field.

Figure 23:
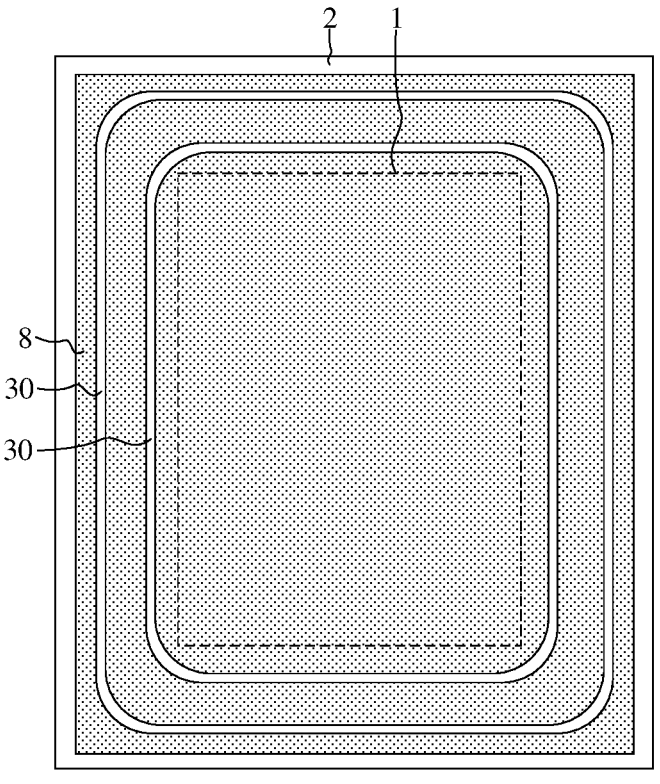
FIG. 23 is a top view of an electrode insulation layer according to another embodiment of the present disclosure.
Figure 24:
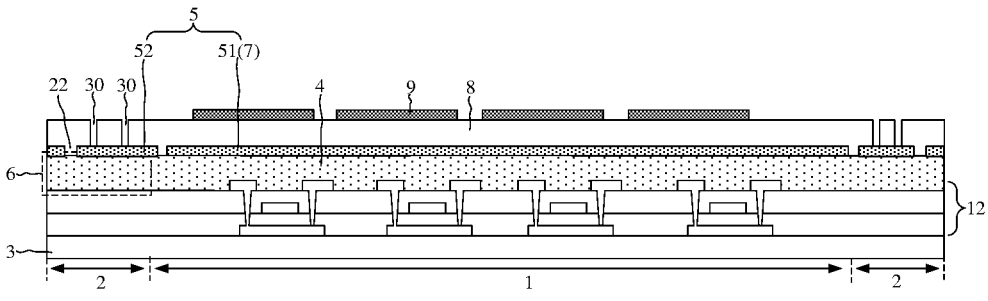
FIG. 24 is a structural schematic diagram of layers of a display panel according to another embodiment of the present disclosure.

FIG. 23 is a top view of an electrode insulation layer according to another embodiment of the present disclosure; and FIG. 24 is a structural schematic diagram of layers of a display panel according to another embodiment of the present disclosure. In an embodiment, as shown in FIG. 23 and FIG. 24, the display panel further includes a first electrode 7, an electrode insulation layer 8, and a second electrode 9. The first electrode 7 is located at a side of the organic layer 4 facing away from the substrate 3. The electrode insulation layer 8 is located at a side of the first electrode 7 facing away from the substrate 3. The second electrode 9 is located at a side of the electrode insulation layer 8 facing away from the substrate 3. The electrode insulation layer 8 includes at least one opening 30 which is an annular opening surrounding the display area 1.

During the study, the inventors discovered that the annular opening surrounding the display area 1 in the electrode insulation layer 8 can further reduce the strain of the layer in the display panel, thereby further reducing the risk of layer detachment of the display panel.

Figure 25:
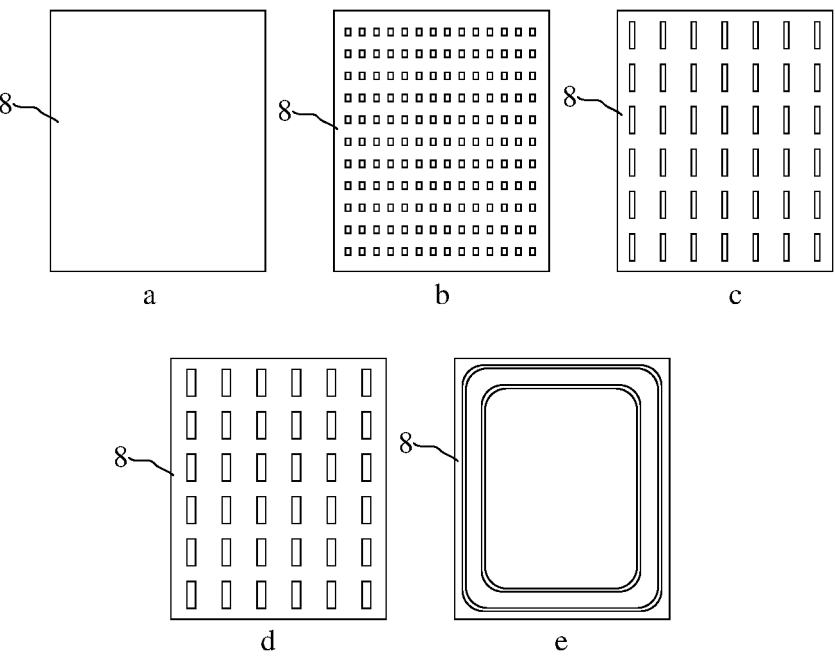
FIG. 25 is a structural schematic diagram of five types of electrode insulation layers according to an embodiment of the present disclosure.

Referring to FIG. 25, which is a structural schematic diagram of five types of electrode insulation layers according to an embodiment of the present disclosure, the present disclosure test the five types of electrode insulation layers 8.

In the first-type structure A, no opening is provided in the electrode insulation layer 8. In the second-type structure B, openings each of which has a size of 10 μm×10 μm are provided in an array in the electrode insulation layer 8. In a third-type structure C, openings each of which has a size of 110 μm×30 μm are provided in an array in the electrode insulation layer 8. In the fourth-type structure D, openings each of which has a size of 120 μm×40 μm are provided in an array in the electrode insulation layer 8. In the fifth-type structure E, an annular opening that extends a width of 10 μm along the isostrain line 33 is provided in the electrode insulation layer 8.

For the fifth structure e, in the embodiment of the present disclosure, in conjunction with the panel stress model shown in FIG. 33, firstly, the panel stress model is constructed according to the structural design parameters and the process design parameters of the display panel, and the stress distribution at different positions is obtained, and it is known that the isostress distribution region tends to be more annular in shape, i.e., a plurality of annular isostrain lines 33 are generated, according to the stress distribution, and then at least one of the isostrain lines 33 may be located at the annular opening.

Figure 26:
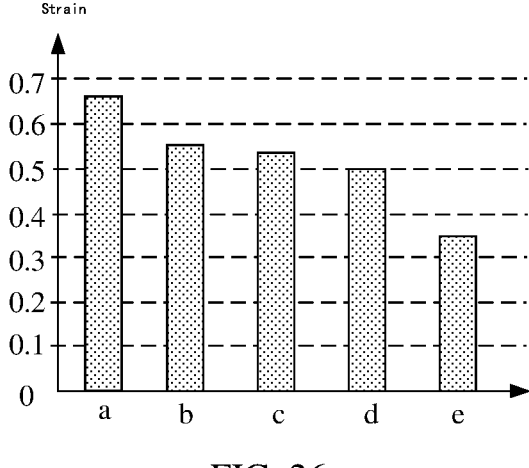
FIG. 26 is a histogram of strain of an electrode insulation layer according to an embodiment of the present disclosure.

FIG. 26 is a histogram of strain of an electrode insulation layer 8 according to an embodiment of the present disclosure; and FIG. 27 is a histogram of strain of a first electrode 7 according to an embodiment of the present disclosure. As shown in FIGS. 26 and 27, when the annular opening is provided on the electrode insulation layer 8, the strains of the electrode insulation layer 8 and the first electrode 7 are effectively reduced, thereby improving the layer detachment problem in the display panel to a greater extent.

Further, the opening 30 may be provided in the non-display area 2 to achieve electrical insulation between the first electrode 7 and the second electrode 9. Furthermore, openings 30 may be via holes that are not used to make electrical connections, or via holes that are used to achieve electrical connections between different metal traces.

In view of the same inventive concept, the present disclosure further provides a method for manufacturing a display panel in order to manufacture the display panel mentioned above. Combining with FIGS. 3 and 4, as shown in FIG. 28, which is a flowchart of a method for manufacturing a display panel according to an embodiment of the present disclosure, the method includes following steps.

Step S1: a to-be-cut display panel is formed.

Step S2: the to-be-cut display panel is cut to form a display panel.

As shown in FIG. 29, which is a flowchart of a method for manufacturing a display panel according to another embodiment of the present disclosure, the step S1 may further include following steps.

Step S11: an organic layer 4 located in the display area 1 and the non-display area 2 is formed at a side of the substrate 3, and includes a first portion 6 located in the non-display area 2.

Step S12: an organic layer protection structure 5 is formed on a surface of the organic layer 4 facing away from the substrate 3. The organic layer protection structure 5 is a earliest formed layer after forming the organic layer 4. The organic layer protection structure 5 includes a first structure 51 located in the display area 1 and a second structure 52 located in the non-display area 2. In a direction perpendicular to a plane of the substrate 3, the second structure 52 overlaps the first portion 6, and the first structure 51 and the second structure 52 are in direct contact with the organic layer 4. The organic layer protection structure 5 includes a plurality of hollow structures 22.

In the manufacturing method described above, after the organic layer 4 is formed, firstly, an organic layer protection structure 5 capable of shielding the organic layer 4 is formed by a film forming process, so that the portion of the organic layer 4 that is shielded is not exposed any more while other layers are formed subsequently. At this time, the organic layer 4 is only exposed outside in a very short time period, i.e., after the organic layer 4 is formed and before the organic layer protection structure 5 is formed, so that the duration of the exposure of the organic layer protection structure 5 during the whole process is effectively reduced, and in particular, the duration of the exposure of the first portion 6 of the organic layer 4 is reduced. Furthermore, the organic layer protection structure 5 may also block water and oxygen from entering the organic layer 4 during subsequent other manufacturing processes, thereby significantly reducing moisture absorbed by the organic layer 4 during the manufacturing process of the display panel.

In addition, as mentioned above, the organic layer 4 is usually formed by a coating process in which bubbles are easily generated. In an embodiment, by providing the hollow structures 22 in the organic layer protection structure 5, the hollow structure 22 can be used to release the water vapor decomposed and absorbed by the organic layer 4 itself and the water vapor generated by the organic layer 4 in a subsequent high-temperature process, thereby reducing the influence of the water vapor on other layers.

In summary, using the embodiments of the present disclosure, not only the moisture absorbed by the organic layer 4 during the manufacturing process can be effectively reduced, but also the gas generated by the organic layer 4 itself and the moisture absorbed during the manufacturing process can be further released, so as to effectively improve the subsequent film release problem.

Before forming the organic layer 4, the transistor layer 12 may be further formed, which is not elaborated herein.

In an embodiment, in conjunction with FIG. 5, as shown in FIG. 30, which is a flowchart of a method for manufacturing a display panel according to an embodiment of the present disclosure, step S12 may include following steps.

Step S121: a protection layer 31 is formed on a surface of the organic layer 4 facing away from the substrate 3, in which a forming material of the protection layer 31 includes a conductive material.

Step S122: the protection layer 31 is etched to form a first structure 51 located in the non-display area 2 and a second structure 52 located in the display area 1, in which the first structure 51 is reused as the first electrode 7.

In such an arrangement manner, since the protection layer 31 has conductive properties, the first structures 51 formed by etching the protection layer 31 can be reused into the first electrode 7 in the display panel. On the one hand, in the manufacturing process, the first electrode 7 and the second structure 52 are formed together. At this time, it is only necessary to adjust the pattern of the mask plate corresponding to the original first electrode 7 without adding additional processes, thereby achieving a simple manufacturing process of the display panel. On the other hand, the first electrode 7 and the first structure 51 only need to occupy one layer thickness, one layer thickness, and it is more advantageous to achieve the light-thin design of the display panel.

In an embodiment, in conjunction with FIG. 19, the process of forming the organic layer protection structure 5 includes: forming a second structure 52 on a surface of the organic layer 4 facing away from the substrate, in which the material of the second structure 52 includes silicon nitride. Since silicon nitride has better anti-moisture and anti-static properties, forming the second structure 52 by silicon nitride can further make the display panel have better anti-moisture and anti-static properties.

In an embodiment, referring again to FIG. 30, step S1 further includes following steps.

Step S13: an electrode insulation layer 8 is formed at a side of the first electrode 7 facing away from the substrate 3. The electrode insulation layer 8 includes a first insulation portion 25, in which the forming material of the first insulation portion 25 includes silicon oxide.

Step S14: a second electrode 9 is formed at a side of the electrode insulation layer 8 facing away from the substrate 3.

Since the silicon oxide has a smaller thermal expansion coefficient and a smaller Young's modulus than the silicon nitride, the residual stress of the layer formed by silicon nitride is smaller. Forming the first insulation portion 25 in the display area 1 by silicon oxide can reduced the residual stress of the portion of the electrode insulation layer 8 in the display area 1, so that the risk of detachment of the electrode insulation layer 8 in the display area 1, thereby improving display reliability.

Figure 31:
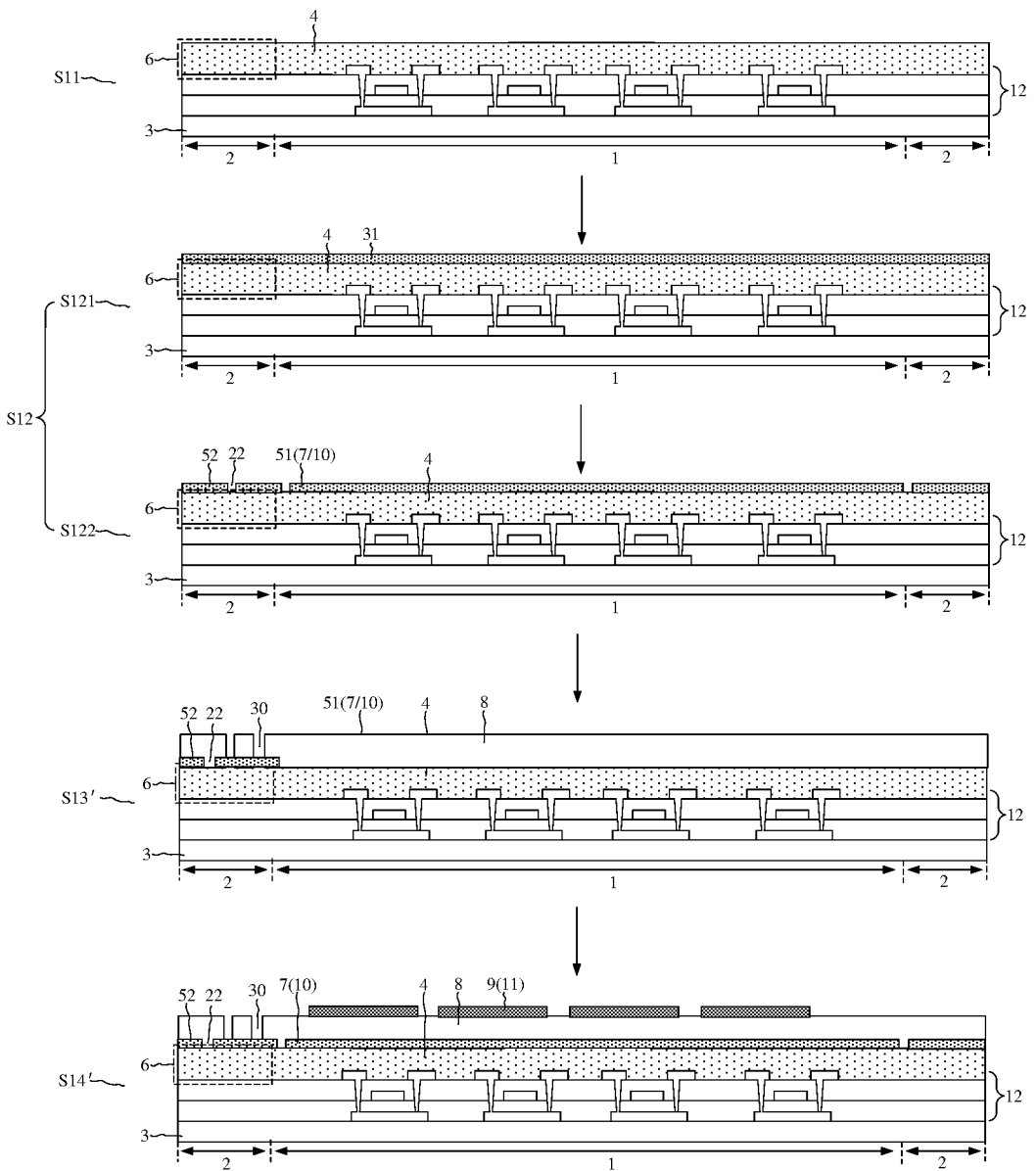
FIG. 31 is a flowchart of a method for manufacturing a display panel according to another embodiment of the present disclosure.

In an embodiment, in conjunction with FIG. 23, as shown in FIG. 31, which is a flowchart of a method for manufacturing a display panel according to another embodiment of the present disclosure, step S1 further includes following steps.

Step S13': an electrode insulation layer 8 having an opening 30 is formed at a side of the first electrode 7 facing away from the substrate 3, and the opening 30 is an annular opening surrounding the display area 1.

Step S14': a second electrode 9 is formed at a side of the electrode insulation layer 8 facing away from the substrate 3.

In combination with the aforementioned analysis, by providing the opening 30 surrounding the display area 1 on the electrode insulation layer 8, the film strain of the display panel may be reduced to a greater extent, thereby improving the layer detachment problem of the display panel to a greater extent.

FIG. 32 is a flowchart of a method for manufacturing a display panel according to another embodiment of the present disclosure, and FIG. 33 is a schematic diagram of a panel stress model according to an embodiment of the present disclosure. As shown in FIGS. 32 and 33, step S13' may include following steps.

Step S131': a panel stress model is built according to structural design parameters and process design parameters of the display panel.

S132': a plurality of isostrain lines 33 is acquired according to the panel stress model, and a position where at least one of the isostrain lines 33 is located is set as a first position.

S133': an electrode insulation layer 8 is formed, and an opening 30 is formed at the first position.

The stress experienced by the display panel is uniform at the positions of the isostrain lines 33, so that setting the position of the opening 30 in the electrode insulation layer 8 according to the isostrain lines 33 can improve the stress uniformity at the position where the opening 30 is located, cracks and the like are less prone to occur at the layer located at the opening 30.

FIG. 34 is a flowchart of a method for manufacturing a display panel according to another embodiment of the present disclosure. In an embodiment, as shown in FIG. 34, in conjunction with FIG. 33, step S2 may further include following steps.

Step S21: a panel stress model is built according to structural design parameters and process design parameters of the display panel.

Step S22: a plurality of isostrain lines 33 is acquired according to the panel stress model, and a position where one of the isostrain lines 33 is located is set as a second position.

Step S23: the to-be-cut display panel is cut along the second position to form the display panel.

After obtaining the plurality of isostrain lines 33, the position at which one isostrain line 33 is located may be selected to be the second position according to the design size of the display panel, e.g., when the design size of the display panel is large, the to-be-cut display panel may be cut along the outermost isostrain line 33.

Since the stress of the panel to be displayed is uniform at the positions where the isostrain lines 33 are located, cutting the to-be-cut display panel along the isostrain line 33 may reduce the risk of cracks of the display panel developing during the cutting process.

In view of the same inventive concept, the present disclosure further provides a display apparatus as shown in FIG. 35, which is a structural schematic diagram of the display apparatus provided in the present disclosure. The display apparatus includes the above-mentioned display panel. The specific structure of the display panel 100 has been described in detail in the above embodiments, and will not be repeated herein. It may be appreciated that the display apparatus shown in FIG. 35 is merely a schematic illustration, and the display apparatus may be any electronic device having a display function such as a mobile phone, a tablet computer, a laptop computer, an electric paper book, or an in-vehicle product.

The above are merely preferred embodiments of the present disclosure, which, as mentioned above, are not used to limit the present disclosure. Whatever within the principles of the present disclosure, including any modification, equivalent substitution, improvement, etc., shall fall into the protection scope of the present disclosure.

Finally, it should be noted that the technical solutions of the present disclosure are illustrated by the above embodiments, but not intended to limit thereto. Although the present disclosure has been described in detail with reference to the foregoing embodiments, those skilled in the art can understand that the present disclosure is not limited to the specific embodiments described herein, and can make various obvious modifications, readjustments, and substitutions without departing from the scope of the present disclosure.

What is claimed is:

1. A display panel, comprising:
a display area;
a non-display area;
a substrate;
an organic layer located at a side of the substrate and located in the display area and the non-display area, wherein the organic layer comprises a first portion located in the non-display area; and
an organic layer protection structure located on a surface of the organic layer facing away from the substrate, wherein the organic layer protection structure comprises a first structure in the display area and a second structure in the non-display area, the second structure overlaps with the first portion in a direction perpendicular to a plane of the substrate; the first structure and the second structure is in direct contact with the organic layer, and the organic layer protection structure comprises a hollow structure; and
wherein, in the direction perpendicular to the plane of the substrate, an area A of an orthogonal projection of the organic layer protective structure and a total area B of the hollow structure satisfy:

$$5.19\% \leq \frac{B}{A} \leq 16.8\%.$$

2. The display panel according to claim 1, further comprising: a first electrode located in the display area, and located on a surface of the organic layer facing away from the substrate, wherein the organic layer protection structure comprises a conductive material, and the first electrode is the first structure.

3. The display panel according to claim 2, further comprising: an electrode insulation layer and a second electrode, wherein the electrode insulation layer is located at a side of the first electrode facing away from the substrate, and the second electrode is located at a side of the electrode insulation layer facing away from the substrate; and wherein the first electrode is a common electrode, and the second electrode is a pixel electrode.

4. The display panel according to claim 3, further comprising: a transistor layer disposed between the substrate and the organic layer, wherein the transistor layer comprises a first transistor;
the first electrode comprises a first body and a plurality of first connection portions that are located in a same layer and electrically insulated from each other, the organic layer comprises a first via hole, and the first connection portion is electrically connected to the first transistor through the first via hole; and
the second electrode comprises a second body and a second connection portion protruding from the second body, the electrode insulation layer comprises a second via hole, and the second connection portion is electrically connected to the first connection portion through the second via hole.

5. The display panel according to claim 2, further comprising: an electrode insulation layer and a second electrode, wherein the electrode insulation layer is located at a side of the first electrode facing away from the substrate, and the second electrode is located at a side of the electrode insulation layer facing away from the substrate; and wherein the first electrode is a pixel electrode, the second electrode is a common electrode, and the common electrode comprises a plurality of sub-electrodes spaced apart from each other, the sub-electrodes are reused as touch electrodes, and the sub-electrodes are electrically connected to a touch signal line.

6. The display panel according to claim 2, further comprising: a light-emitting layer and a second electrode, wherein the light-emitting layer is located at a side of the first electrode facing away from the substrate, and the second electrode is located at a side of the light-emitting layer facing away from the substrate; and wherein the first electrode is an anode, and the second electrode is a cathode.

7. The display panel according to claim 1, further comprising: a first electrode located in the display area and located at a side of the organic layer facing away from the substrate, wherein the organic layer protective structure is located between the organic layer and the first electrode, and covers the organic layer in the direction perpendicular to the plane of the substrate.

8. The display panel according to claim 1, wherein the first portion comprises a groove covered by the second structure in the direction perpendicular to the plane of the substrate.

9. The display panel according to claim 1, further comprising: a sealant located in the non-display area, and, in the direction perpendicular to the plane of the substrate, the organic layer protection structure is located at a side of the sealant facing the display area.

10. The display panel according to claim 1, wherein the hollow structure comprises a plurality of first hollow structures located in the second structure and arranged along an extending direction of an edge of the display area.

11. The display panel according to claim 1, wherein the hollow structure comprises a first hollow structure located in the second structure, and the first hollow structure is a ring structure surrounding the display area.

12. The display panel according to claim 1, wherein the non-display area comprises a first non-display area, a direction from the first non-display area to the display area is a first direction; and
wherein the hollow structure comprises a plurality of first hollow structures located in the second structure, the second structure comprises at least two hollow groups located in the first non-display area and arranged along the first direction, each hollow group of the at least two hollow groups comprises the plurality of first hollow structures arranged along a second direction intersecting with the first direction, and first hollow structures of the plurality of first hollow structures in two adjacent hollow groups are staggered in the first direction.

13. The display panel according to claim 1, wherein the second structure comprises silicon nitride.

14. The display panel according to claim 1, further comprising:

a first electrode located at a side of the organic layer facing away from the substrate;

an electrode insulation layer located at a side of the first electrode facing away from the substrate, wherein the electrode insulation layer comprises a first insulation portion located in the display area, the first insulation portion comprises silicon oxide; and a second electrode located at a side of the electrode insulation layer facing away from the substrate.

15. The display panel according to claim 1, further comprising:

a first electrode located at a side of the organic layer facing away from the substrate;

an electrode insulation layer located at a side of the first electrode facing away from the substrate, wherein the electrode insulation layer comprises at least one opening, and the at least one opening is an annular opening surrounding the display area; and a second electrode located at a side of the electrode insulation layer facing away from the substrate.

16. A display apparatus, comprising a display panel, wherein the display panel comprises:

a display area;

a non-display area;

a substrate;

an organic layer located at a side of the substrate and located in the display area and the non-display area, wherein the organic layer comprises a first portion located in the non-display area; and an organic layer protection structure located on a surface of the organic layer facing away from the substrate, wherein the organic layer protection structure comprises a first structure in the display area and a second structure in the non-display area, the second structure overlaps with the first portion in a direction perpendicular to a plane of the substrate; and the first structure and the second structure is in direct contact with the organic layer, and the organic layer protection structure comprises a hollow structure; and wherein, in the direction perpendicular to the plane of the substrate, an area A of an orthogonal projection of the organic layer protective structure and a total area B of the hollow structure satisfy:

$$5.19\% \leq \frac{B}{A} \leq 16.8\%.$$

\* \* \* \* \*